United States Patent
Bell et al.

(10) Patent No.: US 9,990,764 B2
(45) Date of Patent: Jun. 5, 2018

(54) VIRTUAL TRY ON SIMULATION SERVICE

(75) Inventors: Alexandra Bell, Monaco (GB); Erik Pernod, Villers (FR); Alex Reche Martinez, Peymeinade (FR)

(73) Assignee: Belcurves Ltd, London (GB)

( * ) Notice: Subject to any disclaimer, the term of this patent is extended or adjusted under 35 U.S.C. 154(b) by 145 days.

(21) Appl. No.: 14/005,162

(22) PCT Filed: Mar. 9, 2012

(86) PCT No.: PCT/EP2012/054069
§ 371 (c)(1),
(2), (4) Date: Apr. 4, 2014

(87) PCT Pub. No.: WO2012/123346
PCT Pub. Date: Sep. 20, 2012

(65) Prior Publication Data
US 2014/0225888 A1 Aug. 14, 2014

(30) Foreign Application Priority Data
Mar. 14, 2011 (GB) .................................. 1104312.2

(51) Int. Cl.
*G06T 15/00* (2011.01)
*G06T 17/00* (2006.01)
(Continued)

(52) U.S. Cl.
CPC .......... *G06T 17/00* (2013.01); *G06F 17/5009* (2013.01); *G06T 19/00* (2013.01); *G06T 19/20* (2013.01); *G06T 2210/16* (2013.01)

(58) Field of Classification Search
CPC ......... G06T 19/00; G06T 17/20; G06T 17/00; G06T 15/10; G06T 15/00
(Continued)

(56) References Cited

U.S. PATENT DOCUMENTS

2004/0049309 A1* 3/2004 Gardner .................. A41H 1/00
700/132
2004/0083142 A1* 4/2004 Kozzinn ................. A41H 1/00
705/26.5
(Continued)

FOREIGN PATENT DOCUMENTS

WO 2009090391 A1 7/2009

OTHER PUBLICATIONS

"Virtual-Try-On on the Web" (VRIC, Virtual Reality International Conference, Laval Virtual, May 16-18, 2001; by Frederic Cordier, WonSook Lee, HyeWon Seo, Nadia Magnenat-Thalmann).*
(Continued)

*Primary Examiner* — Gordon Liu
(74) *Attorney, Agent, or Firm* — Kaplan Breyer Schwarz, LLP

(57) ABSTRACT

A method of creating a three dimensional model of a unique body is provided, said method comprising obtaining a three dimensional model of a standard body and obtaining a two dimensional image of the unique body that is to be modelled. The method further comprises determining a location of the unique body in said image and determining a position of the unique body in said image, using the determined location and position data to extract a two dimensional outline of the unique body from the two dimensional image. The method further comprises selecting a measurement for which a value is to be calculated for the unique body, calculating a value of said selected measurement from the extracted two dimensional outline, using said calculated value of the selected measurement to update a corresponding measurement on the three dimensional model of a standard body, and outputting the updated three dimensional model of a standard body as a three dimensional model of the unique body.

20 Claims, 19 Drawing Sheets

(51) Int. Cl.
*G06T 19/00* (2011.01)
*G06F 17/50* (2006.01)
*G06T 19/20* (2011.01)

(58) Field of Classification Search
USPC .......................................................... 345/419
See application file for complete search history.

(56) References Cited

U.S. PATENT DOCUMENTS

| | | | | |
|---|---|---|---|---|
| 2010/0151430 | A1* | 6/2010 | Jones | G06Q 30/06 434/322 |
| 2011/0243409 | A1* | 10/2011 | Naimi | A61B 5/0064 382/128 |
| 2011/0267344 | A1* | 11/2011 | Germann | G06K 9/00201 345/420 |
| 2013/0249908 | A1* | 9/2013 | Black | G06T 7/0085 345/420 |

OTHER PUBLICATIONS

"Contour People: A Parameterized Model of 2D Articulated Human Shape", by Oren Freifeld, Alexander Weiss, Silvia Zuffi, Michael J. Black. IEEE Conf. on Computer Vision and Pattern Recog., 2010.*

Lee, WonSook et al.: "Generating Animatable 3D Virtual Humans from Photographs," Computer Graphics Forum, Wiley-Blackwell Publishing Ltd., GB, vol. 19, No. 3, Jan. 1, 2000, pp. C1-C10.

Hilton, Adrian et al.: "Virtual People: Capturing Human Models to Populate Virtual Worlds," Computer Animation, 1999. Proceedings Geneva, Switzerland May 26-29, 1999, Los Alamitos, CA, USA, IEEE Comput. Soc. US, May 26, 1999, pp. 174-185.

Xu, Richard Yi Da et al.: "Multliple Curvature Based Approach to Human Upper Body Parts Detection with Connected Ellipse Model Fine-Tuning," Image Processing (ICIP), 2009 16th IEEE International Conference on IEEE, Piscataway, NJ, USA, Nov. 7, 2009, pp. 2577-2580.

Zhao, Huiqing et al.: "Reconstruction of 3D Mannequin by Two-Dimensional Photos," Computer-Aided Industrial Design and Conceptual Design, 2008. CAID/CD 2008, 9th International Conference on IEEE, Piscataway, NJ, USA, Nov. 22, 2008, pp. 668-673.

PCT International Search Report for PCT/EP2012/054069 dated Sep. 11, 2012.

* cited by examiner

Fig 5
Fig 6
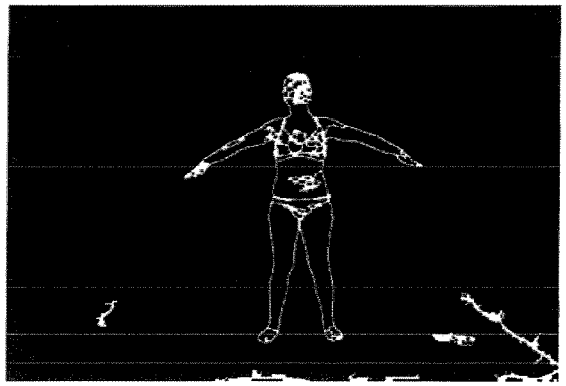
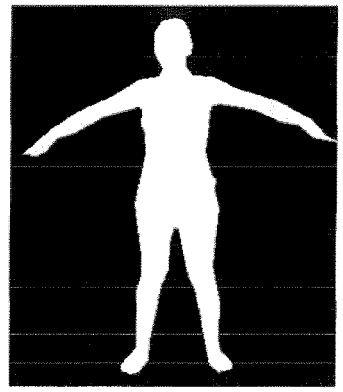
Fig 7
| Subject Shape | DB Shapes | Comparison value |
|---|---|---|
| | | 0.9 |
| | | 0.1 |
| | | 0.001 |

Original girth    Deformed girth

VIRTUAL TRY ON SIMULATION SERVICE

CROSS REFERENCE TO RELATED APPLICATIONS

This application is a national phase of PCT application No. PCT/EP2012/054069, filed 9 Mar. 2012, which claims priority to GB patent application No. 1104312.2, filed 14 Mar. 2011, all of which are incorporated herein by reference.

The invention comprises an improved 3D virtual garment try on simulation and visualisation service. In particular it provides size and style selection based on a body model created from individual consumer measurements and proportions, which are extracted from domestic/consumer images; and a garment model created from garment design data.

BACKGROUND

There is a massive industry worldwide for retail sale of clothes and garments. A traditional retail model involves selling garments from a shop or store wherein members of the public can go to the store, try on a number of garments and purchase their selected garment(s) thereafter. With the increased pace of modern living and consumer demand for greater retail choice, regardless of their own geographical location or availability, online clothes shopping has become popular.

Many online retailers exist which enable a user to view garments online before purchasing them. Often images are provided of models wearing the garments to give an idea of how they will look in practice. However this can be of limited value since the models used in such images are often only of one particular body type or there may be a short list of "body types" to choose from to more closely resemble the consumer but the choices offered will be limited and therefore different to the actual bodies of the consumers using the online retail service.

Offering online services is an attractive option for the retailer who can grow into new territories without the need to build a store. However an issue for the retailers is that up to 50% of all garments bought online are returned. For example, often women order the same dress in two sizes and try them both on at home and return the one that fits less well, as well as trying on at home to see how it suits and drapes. This 50% return rate can cost up to around 10-25% of online retailer revenues, which equates to $billions wasted globally, as the retailers have the unwanted goods shipped back and repackaged and restocked for re sale. So, as well as the original lost sale, the retailer suffers due to the added resources, time and expense involved in the returns process. This is a major issue for online retailers.

Addressing the issues with online clothes retail properly would help the efficiency of the retailer's business, increase the satisfaction and experience of the consumer and impact positively on the carbon footprint if fewer items are returned.

Various approaches are known for improving the reliability of online retailing for the customers. International patent application WO 2009/090391, which is incorporated herein by reference, describes a garment filter generation system and method. The method includes entering body data representing a plurality of points on or under the surface of a body, deriving at least one body proportion therefrom and comparing that body proportion data to garment data in order to filter out garments that are unsuitable for wearing by a person with those proportions. Although useful, that method as described relies on the use of a three dimensional body scanner for obtaining measurement information for a body.

Other online retailers also rely on body scanners for online garment fitting, or rely on a few standard measurements input by the user for their body (only height/waist/hips/bust for example) which is limiting. The small number of measurements used lead to a lack of accuracy and as human input is used, this approach is open to user error.

Some online systems provide only visualisation, for a "try on". This is not analogous to trying on clothes but instead provides an image of clothes mapped onto a 3D body.

Computer graphics for the film ad special effects industry have been visualising 3D characters wearing 3D clothes for many years.

There is no known system or method that can faithfully simulate the trying on of a garment by a user in a straightforward and cost effective manner which would enable it to be used at home by the general public.

An invention is set out in the claims.

According to an aspect there is provided a method of creating a three dimensional model of a unique body; said method comprising obtaining a three dimensional model of a standard body, obtaining a two dimensional image of the unique body that is to be modelled, determining a location of the unique body in said image, determining a position of the unique body in said image and using the determined location and position data to extract a two dimensional outline of the unique body from the two dimensional image. The method further comprises selecting a measurement for which a value is to be calculated for the unique body, calculating a value of said selected measurement from the extracted two dimensional outline, using said calculated value of the predetermined measurement to update a corresponding measurement on the three dimensional model of a standard body and outputting the updated three dimensional model of a standard body as a three dimensional model of the unique body.

According to an aspect there is provided a method of creating a model of a garment, said method comprising defining a plurality of component parts of the garment, obtaining geometric data for the garment, said geometric data being sufficient for the garment to be manufactured from its component parts, obtaining landmark data for the garment, said landmark data comprising at least one indicator to determine the position of a connection to be made between first and second parts of the garment and using said geometric data and landmark data to generate a model of component parts of the garment.

According to an aspect there is provided a method of modelling a garment for simulating fitting of that garment to a body, said method comprising obtaining a three dimensional model of the body and defining a grid surrounding said three dimensional body, wherein individual cells of the grid encompass different respective portions of the modelled body. The method further comprises obtaining a model of the garment to be fitted, said model including first and second parts of the garment separate from one another, positioning said first and second parts of the garment in selected cells of the grid, wherein said cells are selected according to a relationship between the encompassed portions of the modelled body and the first and second parts of garment; and aligning said first and second parts of the garment in preparation for bringing them together around the modelled body.

According to an aspect there is provided a method of simulating the fitting of a garment to a unique body, comprising obtaining a three dimensional model of the unique body, obtaining a three dimensional model of the garment to be fitted, implementing a collision between said three dimensional model of the unique body and said three dimensional model of the garment; and outputting a visualisation of the fitting as a result of said collision.

FIGURES

Embodiments and examples will now be described with respect to the figures of which:

FIG. 2c show a flow diaphragm for virtual try on;

FIGS. 5 and 6 show the extraction of a detected contour from the image of FIG. 3;

FIG. 7 shows the comparison of a detected contour to a plurality of shapes from a database;

OVERVIEW

Figure 1:
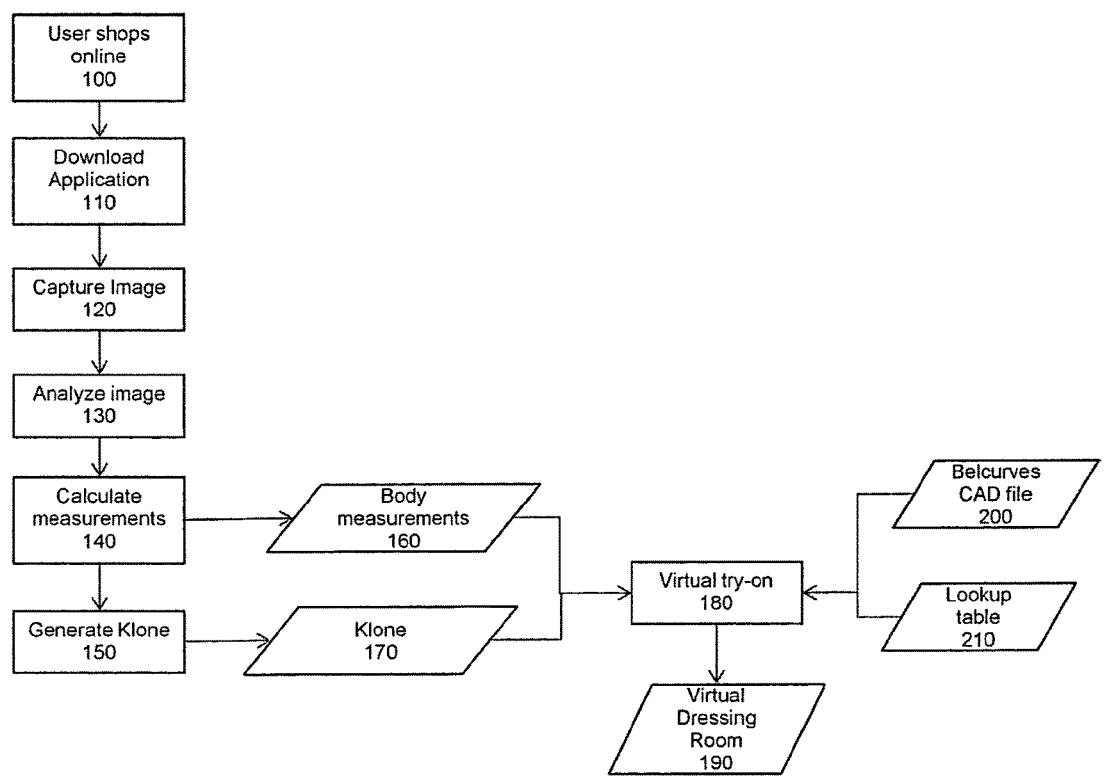
FIG. 1 shows a high level overview of an online garment fitting process.

In overview there is provided a method and system that enables consumers to "try on" garments in a virtual environment, for example online, in order to obtain a realistic simulation of how a garment would fit, look and drape on that consumer's body before they make a decision as to whether to order or purchase said garment.

In order to achieve this, a faithful replication of the consumer's body is created using appropriate processing software. The body is replicated in the form of a digital three dimensional (3D) model. As described in detail below, in order to form the 3D model, the real measurements of the human being are used, rather than standard measurements such as chest, waist size, hip size, as relied upon by other systems.

Once the three dimensional model of the human has been created, garments can be virtually tried on in an effective simulation. To enable this, garment models are created in 3D using the real geometry of the pieces that make up the garment design as created by the designer. The 3D garment is tried on the 3D body, i.e. draped on the body of the model to show how they would fit in practice, during the simulation. The garment model used is a three dimensional draping version of the garment. It is tried on using real physics including the physical dynamics of the cloth behaviour with gravity and cloth collisions against the body's form. Rather than providing a visualisation by merely overlaying the image of a garment on the 3D body model—for example using 2D warping or morphing the simulated try on makes use of dynamic calculations to fully simulate the real physics of the user trying on the garment. Therefore the system does not simply rely on two dimensional maps or images of garments but can actually provide a complete three dimensional simulation of how the garment will fit and drape on the body in real life.

In order to make the garment fitting service accessible, the measurements of the human for creation of the digital 3D model can be captured using domestically available equipment such as a digital camera, video recorder or webcam. As described in detail below, the measurements from which the three dimensional model will be created are extracted from the actual images captured on that camera, recorder, web cam or any other consumer image acquisition device Therefore a realistic set of data, including the body measurements and proportions that actually contribute in the simulation of how garments fit or drape on that individual, are obtained and used.

Unlike prior art methods, the present method and system can capture a sufficient number of measurements that will reproduce a faithful copy of a human body in a digital 3D model. The model will include the unique body shape of the person in question including their particular curves, which can affect fit and style choices not just those measurements that are conventionally required for clothes sizing such as bust, waist and hip size. The method does not require the use of a body scanner or any other expensive or inaccessible equipment. Instead it can use equipment found in many homes and available to a large proportion of the public in order to produce a recognisable three dimensional model for the consumer.

Images obtained from a consumer image acquisition device are analysed so that accurate measurements are extracted therefrom which form the basis of the construction of the three dimensional model, firstly recreating the body shape and both convex and concave curves of the human. The measurements are also taken into account to make sense of the virtual curves during the draping process, as described in more detail below. The draping process takes in to account real world considerations such as gravity on body curves, fabric weight, texture and elasticity, so that the user can obtain a highly accurate and useful simulation of how a particular garment would fit him or her before purchasing or even seeing the garment in real life.

DETAILED DESCRIPTION

FIG. 1 provides a high level overview of the virtual garment trying process.

From a user perspective, when the user is shopping online 100 and wants to simulate garment try-on the first step in the process is to obtain a copy of the 3D model creation from consumer image software 110. The application may be downloaded from an online store, via a website link, from removable hardware storage such as a CD or USB memory or via any other appropriate means. Although reference is made here below to use of a "computer", the application may be run on any suitable processing means such as a computer, smart phone or other handheld processing device. Once the application has been downloaded to the user's computer, they can then begin using the software to create a 3D model of themselves. To do so they must capture an image 120 or preferably a set of images of themselves. As mentioned above, this can be done using any suitable equipment such as a digital camera or video recorder connected to a computer. Alternatively it can be done using a webcam or phone or other consumer image acquisition device. For example stereo image capture devices which use cameras to take a 3D stereoscopic image. Some users may also have access to advanced image acquisition devices such as a depth acquisition device range finder device or x-ray device which can obtain user body measurements even when the consumer is clothed, however such advanced devices are not necessary for successful operation of the present system and method.

When the application software is running on the user's computer or other hardware, it can provide instructions to the user for capturing suitable images. The instructions can be interactive and may comprise a demonstration such as a video demonstration, or animated character interaction. The instructions cover, inter alia, how the user should dress for the image capture. For example the user may be instructed to dress in underwear, swimwear or a leotard and tights with their hair up off their neck and away from their face, so that their body can be seen and is not disguised in the images. The instructions can also include advice on how to use a calibration target for scaling purposes, as discussed further below.

Going back to FIG. 1, once the set of images has been captured in accordance with the instructions provided by the software, they are submitted to the software for individual processing. The images may be directly acquired by the computer uploaded from the consumer's computer or submitted in any other appropriate manner. The images are then analysed. As described in detail below, this analysis involves extraction of data from the images so that measurements can be calculated 140. It is not necessary to upload the images to a web server for the calculation step 140. This is beneficial from the perspective of consumer privacy.

The calculated measurements are used for two purposes. Firstly, they are used to generate 150 a unique three dimensional model representative of the consumer's actual measurements, referred to herein as a "klone" 150. Secondly, they are used to keep a record of the consumer's body measurements 160 which can be used in combination with a conventional three dimensional model during the virtual try on process. As discussed in the overview above and again in more detail below, the virtual try on simulation involves in three dimensional graphics representing selected garments on the user's three dimensional model.

Calibration

Figure 2A:
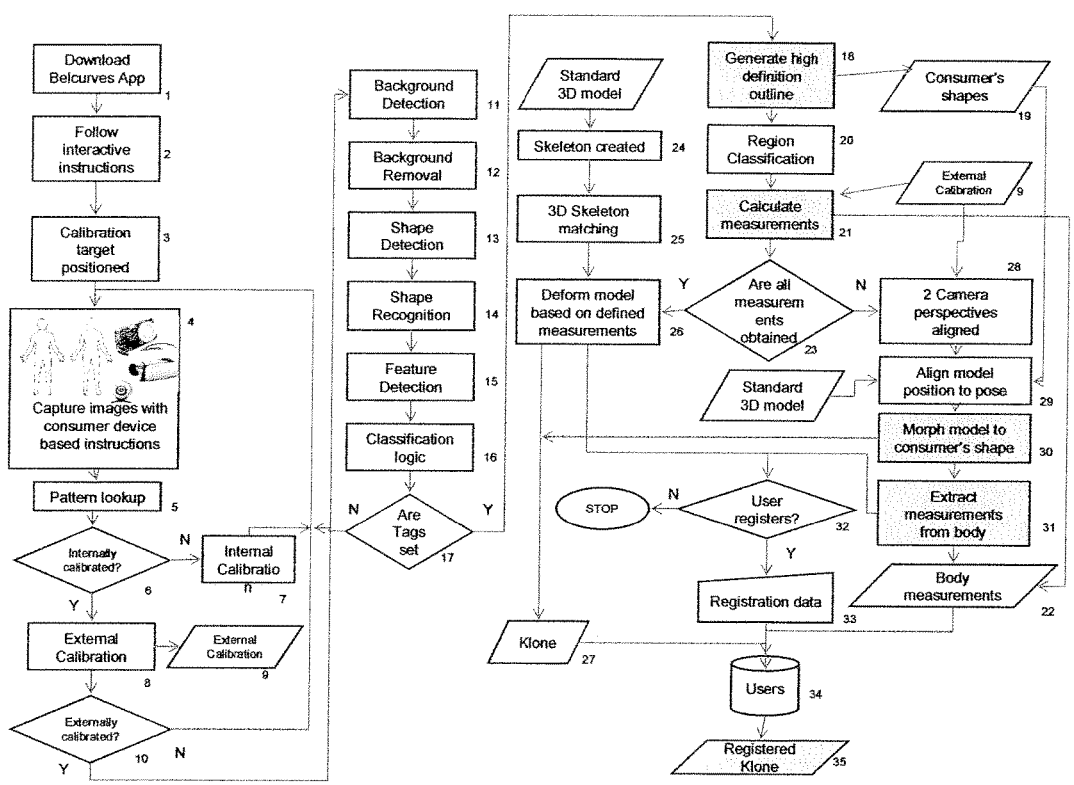
FIG. 2a shows a flow diagram for three dimensional model creation from user obtained images.

In order for measurements to be extracted from the images which are to provide the system, information must be provided regarding the scale factor of the images. As shown in FIG. 2a herein, one approach for doing this is to provide a calibration target. Alternatively, calibration can be omitted and instead the image scale factor can be gauged using a standard measurement, for example a length on a measuring tape or ruler. Alternatively, the size of an object, visible in the image, can be known to the processor and/or can be manually input. However, skipping the calibration process may result in measurements of lower accuracy, and so in this example we use a calibration target.

In practical terms, when a user downloads an application for running the online try on simulation system on their computer, they may be provided with a graphic representing a scale or calibration target that they must place in the image(s) of themselves, visible to the camera lens, for provision to the system. By inclusion of a scale or calibration target in this manner, the system can recognise the distances between the user and their camera or other image capture device and therefore can accurately assess the real size of the user's body from the images.

The system can include instructions regarding how the consumer should pose for its images. For example it can show them how to achieve a number of required positions using an instructive clip or video which accompanies the application. For example if the user is making use of a webcam for his or her image capture, they may be able to line up the image being captured by the webcam with an outline of a body in a certain position as shown on screen by the system, therefore maximising the usefulness of the images being taken by the user.

Preferably the images should be taken using domestic lighting and with a neutral background. The photos of the various user positions required for creation of the three dimensional model should be taken in a single session. If the image acquisition device allows it, the photos should be taken, i.e. shutter released, by the computer on which the system is running. This improves the interactiveness of the process, thereby making it more user friendly.

According to an embodiment, in a client/server implementation of the system, the images themselves are not uploaded to the server but will remain on the consumer's device and therefore will remain private. Instead of actually extracting the images themselves, the system will extract data from those images such as measurement data, proportion data, skin and hair tone data, and eye shape. Only that extracted information will then be uploaded for processing to create the three dimensional model. In a fully online implementation of the system, images can be uploaded to the system server and immediately removed after processing and data extraction.

As shown in FIG. 2a, the process preferably involves both an internal calibration 7 and an external calibration. Internal calibration 7 involves calibrating the image acquisition device account for deformation that the device itself generates on the acquired images. Known computer vision techniques can be used to find the internal parameters of an acquisition device. Typically those internal parameters include focal distance, vertical and horizontal viewing angles, sensor size and resolution, lens distortion, colour correction and sensor noise. The internal parameters obtained for the image acquisition device can be used to fix any geometric or colorimetric deformations which might be added to the obtained images by the acquisition device itself. Optionally, the system may include an interface via which the user can input detail of the image acquisition device used to assist in the internal calibration process.

In FIG. 2a there is a "pattern look up" step 5 shown as part of the internal calibration process. According to an embodiment, the user can be required to capture an image of a pattern, for example one which can be printed out by the user once the application for the simulated try on service has been downloaded to their computer or one that is professionally printed and provided to the user via post or in store or by other suitable means. By looking at an image as captured by the user's image acquisition device of a known pattern, the computer or other processor can derive internal parameters for the device.

Similarly, an external calibration 9 must be carried out so that the position and the orientation of the image acquisition device with respect external bodies is known. Again, known computer vision techniques can be used to calculate the external parameters of the user's image acquisition device. Those external parameters include the position and rotation of the acquisition device with respect to the body being imaged. According to an embodiment, the user can be instructed to put a pattern on the floor in the vicinity of where they are standing for the image acquisition process. Using the internal and external parameters of the camera, the system can precisely locate the pattern in 3D space. Therefore if the user stands next to or on the pattern on the floor, the system can know where the floor is in the image, thereby locating the feet of the user and providing an indication as to the distance between the user and the image acquisition device. That distance can be used to calculate a scale factor for the image. This scale factor can be applied to the measures extracted from the image in order to get real 3D measurements of the person represented in those images.

As will be appreciated from the further description below, the external calibration 9 information obtained for the user's image acquisition device can be used each time there is a conversion from two dimensional to three dimensional data and vice versa during operation of the system.

According to an embodiment, the calibration pattern to be used for calibration of the image acquisition device comprises a black square with thick borders in white background. The middle of the square includes a colour calibration drawing with basic colours such as red, green and blue. The size of the square as well as the thickness of the border and the colour design are known by the system. Because the size of the square as well as the thickness of its border and the colour design will be known to the system, it can locate the pattern on an image when it appears in any random position, using standard image processing techniques. Hence the calibration pattern enables the system to locate the user in space from within a captured image as well as to extract user body measurements from such an image.

Dependent on the type and model of image acquisition device used, the system may be able to carry out internal calibration to find internal parameters of the acquisition device automatically. If it can do so, the calibration pattern mentioned above is only used for external calibration to enable the system to locate the user in space. If however the system cannot or does not carry out internal calibration automatically it can instead use the pattern to obtain internal parameters of the image acquisition device since the pattern is known to the system and therefore the system can see whether and how the acquisition device has deformed the pattern in the images provided by the user. The internal 7 and external 9 calibration steps can be repeated as often as needed to ensure accuracy, as shown in FIG. 2a.

Once the internal and external calibration steps have been carried out, the system can then begin further processing the images of the user in preparation for creating a three dimensional model.

Background Removal

As mentioned above, ideally the images of a user should be taken using domestic lighting and a neutral background should be used. However, regardless of what type of background is used, the system must not include the background in the three dimensional model of the body. Knowing the background helps the system to recognise the subject in an image and to detect what part of the image are shadows.

Background subtraction techniques will be known to the skilled reader. Any appropriate technique for background subtraction may be used by the present system. Because a series of images are captured by the user, the system can ascertain the difference between the background and the user, i.e. the central body in the image, for each of a number of images. If the portion of the image which is identified as being background varies too much between the different respective images, the system can prompt the user to recapture images and/or to provide additional images to improve the background subtraction process. For example, one of the images requested by the system could be an image of the background alone, without the user also being present.

Once the background has been detected to within an accepted degree of accuracy by the system, the background removal process can begin. The system operates so that an input to the background removal process 12 is a series of calibrated images provided by the user, wherein the content per se of the images are unknown, and the output is an image wherein only the part(s) of the image which have not been identified as being part of the background are conserved. The background removal model within the system operates so as to remove the background from the images, leaving only the subject matter (i.e. the person being imaged) without any shadows.

Shape

The next stage in the model creation process is shape detection 13. The input to the shape detection stage is an image wherein only objects which are not part of the background are visible. For the purpose of the virtual simulated try on service described herein, it will therefore be an image of the person without any shadows and without the background from their original images. The output of the shape detection model is the contour of the main central object of the processed image. Again for the purposes of the simulated try on service, that subject is the person for whom the three-dimensional model is to be created.

Because the shape detection step 13 is a preparatory step for creation of a three-dimensional model, the detected contour must be precise enough so that the person's shape can be accurately recognised.

To improve the shape detection process, the present system preferably does not conduct a mere pixel classification. Instead, it performs contour detection on the subtracted image which has been an output at the end of the background removal process step 12. Because the background removal has removed almost all the background details from the original image, said contour detection process can concentrate around the desired subject, i.e. the person being imaged, and can provide a good representation of their form. If any pixels are missing from the person's image that could produce gaps in the subject contour, a series of dilation and contractions may be done. To ensure that only the contours of the person are used, not any contours from the background, the system can select particular contours for further processing. Preferably the system will focus the contours that are closed, that have a set parameter relative to the overall size of the image and which are situated around the centre of the image. Application of such criteria enables all detected contours except the contours of the person's body to be eliminated from the image.

Figure 3:
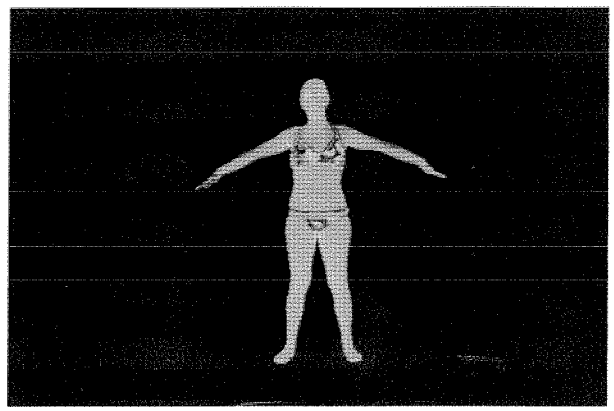
FIGS. 3 and 4 show the results of contour detection of an image with the background removed.
Figure 4:
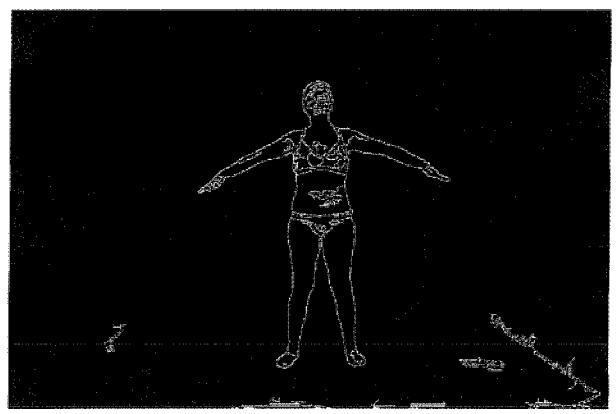

The contour detection process conducted in this manner is accurate enough to enable the system to decide if the person shown in the image is stood in a particular stance or position. For example FIG. 5 shows the body image shown in FIG. 3 herein after the contour processing has been applied thereto. The image in FIG. 5 is sufficiently detailed and accurate for the system to ascertain that the subject's arms are extended outwards, rather than being down by their sides. The system can therefore use this information in order to classify the pose shown in the image. As mentioned previously, instructions for the system can include instructions for the user to capture images in a number of different poses. The system can use the predetermined poses from its instructions to assist in determining user position or stance in the images to which the contour detection has been applied. As discussed in more detail below, the system can decide at any of a number of stages in the process whether it is going to use a particular image for creation of a 3D model therefrom. If the system decides that it will use a particular image, it can further refine the contour therein in order to obtain the best possible measurements therefrom.

After shape detection, the next step in the process shown in FIG. 2a is shape recognition step 14. The system preferably includes a database of possible human poses as shapes. For example these shapes can be hard coded in the programme. The detected subject shape, for example as shown in FIG. 6 herein, is compared with those shapes in the database. A suitable comparison algorithm is run and returns a value to show the similarity of the image shape with a number of the database shapes. In the examples shown in FIG. 7 the output of the algorithm is a value in the range of 0 to 1 wherein, the closer to 0 that value is, the more similar the two shapes are to one another. If the comparison returns 0 the shapes are identical. In order to prevent possible false negatives due to scaling issues the shape output from the shape detection stage 13 is scaled to be the same size as the shapes in the database before the comparison is made. The shape in the database with the best comparison result is assigned to the associated image as a possible candidate for an image classification, discussed further below.

Features

As well as recognising the shape of the person being imaged, it is important that the system can detect their human features in order to be sure that there is a person in front of the camera and to better recognise his/her poses and body positions. The system can use known feature detection 15 techniques to find features such as a person's face, hands or feet and so on. In the example of faces, different kinds of faces can be detected such as front facing and side facing. Detecting one of those features not only tells the system that a human is in front of the camera but also specifies which way the body is facing. Similar processing could be done detecting the hands in order to be able to better define the position of the arms.

At this stage in the process, this system knows at least approximately where the subject is placed in the image and therefore can create a region of interest in which it can be sure that the feature it is looking for, in this example the face, is contained.

Classification

Before generating the klone to represent the user for virtual garment try-on, the system has to make a decision on two questions: Is there a person in front of the camera? And is the person standing in an acceptable position? An acceptable position being one of the positions the system needs for further processing. To respond to those questions, the system will use the different data gathered during the shape recognition 14 and the feature detection 15 steps described above.

It is important that the system can obtain a sufficient amount of data and can be sufficiently confident of the accuracy of that data before it is used for creation of a three dimensional model. Therefore some classification of the processed images is required. At 16 shown in FIG. 2a, classification logic is applied to the processed image. By way of example, the system may apply a tag to one or more images with respect to each of the preceding steps of the process to indicate a corresponding confidence value. Therefore one tag may indicate confidence with respect to shape detection 13 and another may indicate confidence with respect to feature detection 15. A unique tag with a single overall confidence value for an image as a whole can be output from a plurality of process step tags. If the overall confidence with respect to an image is low, instead of producing a tag an output can be produced which indicates that not enough information is available to make a good decision for three dimensional modelling from that image. If the application has sufficient confidence with respect to a particular pose shown in an image, that picture can be tagged and processed further for creation of the three dimensional model.

At 17 in FIG. 2a a question is asked as to whether any tags have been set. If they have been, this indicates that the user has provided at least one image from which a three dimensional model can be generated by the system. If no tags have been set then there are no pictures which have been processed to a suitable degree in order for the three dimensional model to be created at the present time. In such as case, the consumer may be asked to submit new images for processing according to steps 13 to 17. Preferably, images that are not "ok" to be processed are rejected and never used again. Each image provided by a user will be processed separately according to the steps 5 to 17 shown in FIG. 2a. When one image is accepted or rejected, the steps can be repeated for another image.

Creation of the Three Dimensional Model (Human)

Although the shape and contour detection 13/14 discussed above is useful for classifying the pose in which a person is standing in a particular image, it cannot be used as a real outline of the person for the calculation or extraction of measurement. Advantageously, the present system is arranged to perform additional steps in order to create a high precision outline of the person, which can be accurate to within a tenth of a pixel, from which measurements can reliably be extracted and calculated.

According to an embodiment, two approaches are used for getting a better estimate of the outline of the person. The first comprises calculating the contour derivatives and moving every vortex of the approximated outline to the closest 0 crossing point. Contour derivatives are known to give much higher precision when estimating a contour than a contour itself can give. A contour can be estimated from contour derivatives with at least a precision of a tenth of a pixel.

To further refine the contour and to account for any imperfections remaining due to background details or details on the garment worn in the image, hiding the real outline, an additional refinement step is carried out. The additional refinement step comprises fixing any such imperfections by calculating a histogram of curvature for an outline and comparing and fixing abnormalities of the histogram by suppressing and adding points to the outline where abnormalities are detected. A curvature estimation algorithm can be used which takes into account possible noise that the outline could have, thereby enabling the curvature at each point of the outline to be calculated. The abnormality detection process employed by the system can use common general knowledge about the pose adopted by the person in the image under analysis. For example if the current pose consists of the person facing the camera with their arms extended and legs slightly open, the only places where a high concave curvature should occur is in the crotch and under both arms. In an overweight person, high concave curvatures can also be found in the knees and around the hips and waist. Whereas high convex curvature points can only be found in the fingertips. During operation of the present system, when a point of the outline is detected as an abnormality or anomaly it is deleted. Once all anomalies have been deleted the system can then fill in any spaces remaining by estimating new points using the curvature on either side of the empty space.

Therefore the system employs an intelligent refinement process. As described above, the process preferably involves making use of contour derivatives to reposition points or vortices on the approximated outline to enhance its precision. It further preferably comprises abnormality detection, in particular abnormality detection which makes use of common general knowledge about body shapes in particular poses. The system thus makes use of known characteristics of body shapes and poses at an appropriate stage in the model creation process without compromising the accuracy of the image processing. In fact, it has been recognised herein that use of common knowledge in this stage of the process actually enhances the image processing and improves the accuracy of the outline of the body. Similarly, it has been identified herein that estimating new points using the curvature on both sides of an empty space makes the overall contour more accurate than using an anomaly resulting from preceding steps in the image processing method would do. As a result, a high definition outline of the user can be output.

Once the high definition outline has been generated 18, the consumer's shape can be captured as step 19. This output can be used to align a standard three dimensional model to the consumer's shape as shown at 29 in FIG. 2a and as discussed further below.

Region Classification

The high definition outline generated by the system can also be used for region classification, whereby the system separates the image into probabilistic regions.

As an initial step in the region classification process, the system can determine the height of the person shown in the image. In order to assist with this, the application (which is run on the user's hardware to implement the system as described herein) may include an interface via which the user can input their height details. Regardless of whether those height details have been input, the system can find the height of the person being imaged. This can be done firstly by locating the feet by looking for the lowest part of the contour in the image. Because the images are calibrated, the lowest point of the contour can readily be found by reference to the floor, for example using a known pattern placed on the floor during the external calibration stage discussed above. The lowest point of contour on a body could be right or left toes if the image under processing includes a person facing the camera. Alternatively, the lowest part of the contour can be the right or left heel if the person has their back to the camera. Or the lowest point of the contour could be the toes or the heel of either the right foot or left foot if the person is shown side on to the camera.

Figure 8:
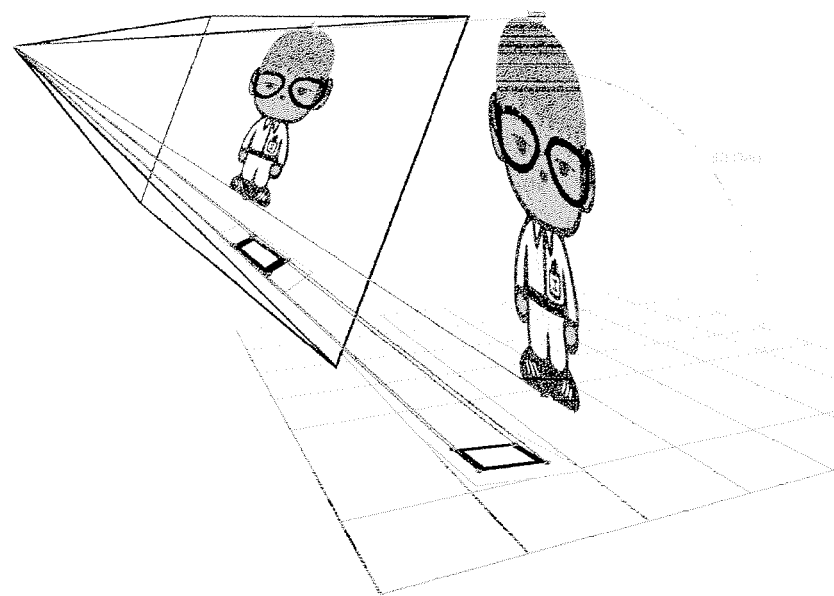
FIG. 8 shows the projection of a body image and a pattern onto a plane for body height detection.

FIG. 8 shows an example of how the lowest and highest points of the contour can be projected onto a plane and compared to projection of the known pattern which is used for the external calibration discussed above. Since the distance between the highest point on the contour and the lowest point on the contour defines the person's height, providing that the pattern is on the floor, the lowest part of the contour will be projected onto the same plane as the pattern. The highest point on the contour can then be projected into a perpendicular plane to the floor, facing the camera and placed in the 3d projection of the lowest point.

Once the height of the person has been calculated from the user's image(s), the image(s) can be further divided into regions 20 in which a probability of finding particular measurements is the highest. For example a region can be defined or classified wherein the waist measurement is likely to be found. Preferably the system uses images of two different poses for the same user in order to define regions of maximum confidence for locating particular measurement types.

Once the high definition outline has been created and the probabilistic regions have been defined, the system can calculate measurements 21 from the processed image of the user. Although the image has been processed to an extent before the measurements are calculated, the measurements are extracted from the image itself rather than being extracted from a generic model. The measurements do not rely on numerical inputs from the user, although the system may include an interface for the user inputting such measurements. Nor does the system rely on estimation of the measurements based on generic models or other database information.

As will be appreciated from the foregoing description, at the point at which the measurement calculation begins the system should know the pose of the person in the image under analysis and it should have defined a set of regions wherein particular measurements may be located. It may also have populated a database with any measurements that have already been detected, such as the person's height discussed above.

It will be appreciated that each image of an individual will be different and each pose requires different respective processing steps in order for measurement information to be extracted therefrom. However the principle of measurement extraction from the images as described herein applies to different image and pose types. At the beginning of the measurement extraction one of two situations can apply to a particular measurement value. Firstly the positioning of the measurement may be completely unknown to the system. Alternatively, the positioning of the measurement may already be known from another image or from a previous processing step. In the former case, the probability regions defined in 20 of the process shown in FIG. 2a can be used to locate the position of the measurement in question. In the latter situation, the measurement can be located more precisely from information already available to the system. In the situation where the precise location of the measurement is already known, the measurement data can be extracted from the high definition outline, for example by measuring a two-dimensional width therein. A standard 3D model can be used in conjunction with the high definition outline of the individual to assist in the measurement extraction. This is discussed further below.

In the situation where the precise position of a particular measurement is not yet known, the system can analyse the probabilistic region where the measurement is supposed to be by rastering a line through the region. Rastering is a scanning technique that will be known to the skilled reader. In the present system, at each step of the rastering, the intersection of the horizontal rastering line with both sides of the consumer's body contour is recorded and the distances between those intersections is identified as a width of a part of the body. The variation of that width through the rastering process defines an area where concavities and/or convexities of the high definition outline give rise to a width with either a minimum or maximum value. The system can select a maximum or minimum width dependent on the measurement it is seeking—for example hip measurement requires a maximum width whereas waist measurement requires a minimum width. The two intersection points associated to the selected maximum or minimum width value are then projected into 3D space to calculate the 3D width of the measurement. This calculated 3D value is recorded as one of the 3D widths for that measurement in question. The 3D position of the measurement is then calculated based on the positioning of the two projected intersections.

In the event that the system cannot find a width with a maximum or minimum value in the probabilistic region identified for a particular measurement it can decide to ignore that image and to instead use another image in order to obtain the measurement data. This may involve assessment of images previously input by the user and/or prompting the user to input additional images.

After all the images have been processed and measurements computed from those images, the system will have a set of 3D values to represent a number of girths and lengths of the model which is to be created. Examples of girths and lengths for which the system can obtain 3D values include heel to toe, ankle to knee, knee to thigh, thigh to hip and hip to waist. The final value for each particular measurement (girth or length) that should be used in the created three dimensional model is a combination of two or more of those 3D widths obtained from the image data for that measurement. For example if multiple different heel to toe lengths are computed from different images for the same individual, the mean value can be computed for use in the three dimensional model and the standard deviation of the measurements can be kept as a measure of possible error. For girths, the system must consider shape as well as length values. The system can accommodate this by approximating body shapes to geometric shapes. For example the shape of a waist can be approximated to an ellipse. It has been found that such an approximation is sufficiently accurate for creation of the three dimensional model. The ellipse approximation can be implemented by separating all the measured lengths for the individual into two clusters or groups, for each of which the mean and the standard deviation is calculated. The two means are used as the lengths of a two ellipse axis and the standard deviation is used to control the shape of the ellipse, as a result of which an accurate representation of the individual can be created. The standard deviation provides information about the shape. For example a standard deviation of 0 indicates the shape to be a perfect oval whereas a large deviation indicates that the shape is more rectangular than elliptic.

At the end of this process, shown as step 21 in FIG. 2*a*, the system can output a set of body measurements to be used later in the process for creation of the unique three dimensional model or "klone". The measurement data comes from the user's images themselves and therefore will be useful in creating a realistic three dimensional model of that user and for showing how garments will fit that user during the trying on simulation process.

Base Model Preparation

The system uses a specially prepared base model for creation of the user "klone". Preferably, the base model comprises a three dimensional skeleton which can be matched to the measurement data extracted directly from the user's images for klone creation. In order to prepare the skeleton, a generic skeleton is fitted to mesh representing a standard 3D body model. The system may use any appropriate standard three dimensional model skeleton fitting technique which will be known to the skilled reader in order to fit the skeleton to the mesh.

The mesh creation process for the standard 3D body model can operate according to a number of constraints. For example it may require that the mesh is fully closed, that it does not contain any duplicate edges or strong degenerated triangles, or that any vertex from the model must be able to reach any other vertex therein. The mesh reconstruction can be implemented using any suitable known software. It should also be capable of controlling the model output complexity, keeping the volume coherent and making the body model independent of the import complexity. Once the mesh is created, the skeleton is placed on the standard 3D model.

Once a standard 3D mesh and corresponding skeleton have been created, the skeleton can be manually modified or constrained. This is done before the software is supplied to the end user as the skeleton is non-user specific. The skeleton will be later on used to locate in the standard model the measurements extracted previously from the user images. For that reason is important that the skeleton of the standard model uses the same interpretation that the image analysis processes makes during the extraction of the data from the images.

3D Model Morphing

Figure 9:
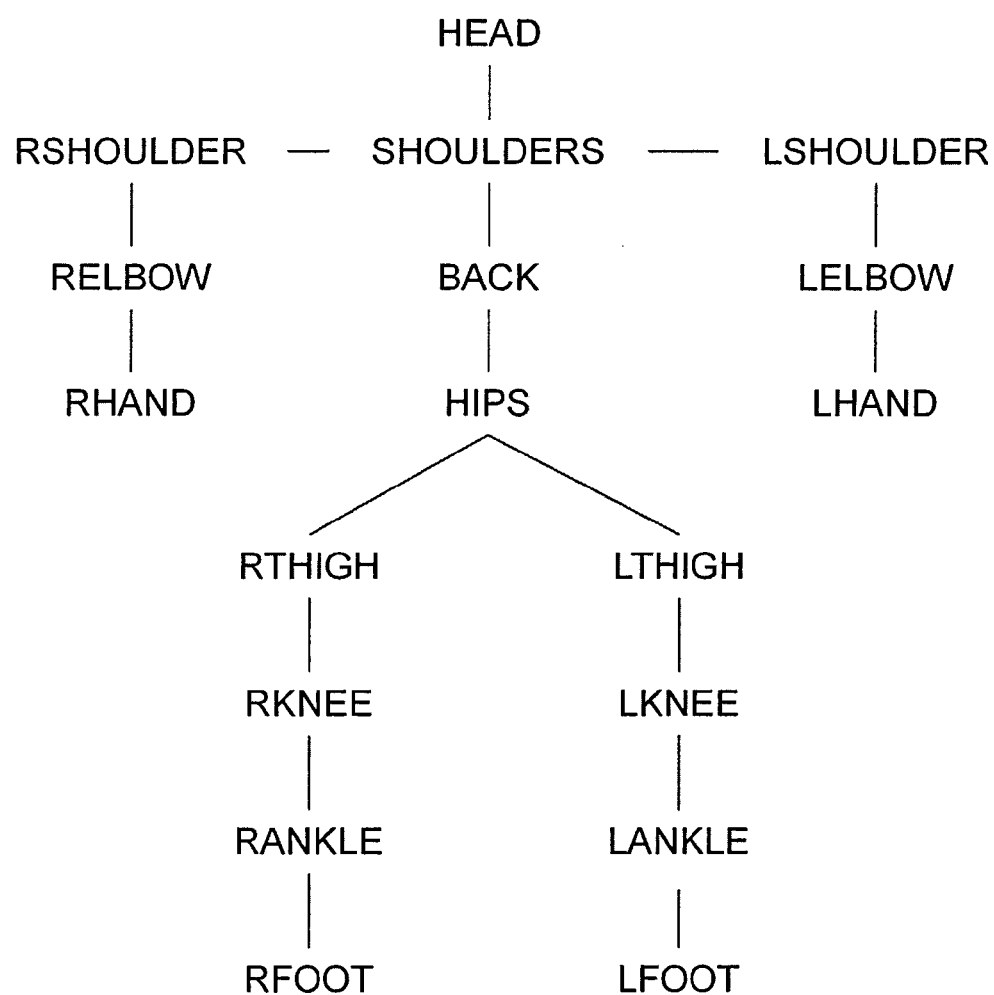
FIG. 9 shows a possible region classification for a body.

The 3D skeleton that was originally created from a standard 3D model is matched with the measurements taken from an individual user's images as shown at step 25 in FIG. 2*a* herein. Thereafter, that skeleton can then be used to create a new three dimensional model or "klone", which is deformed as compared to the standard 3D model, wherein those deformations reflect the actual measurements obtained from the user's images. As shown in FIG. 9 herein, reference definitions can be used to match the measurements obtained from the user's image data to portions of the skeleton for creation of the deformed body model.

Because the skeleton and the model to be created therefrom are three dimensional, the matching should be a two step matching system, wherein a length or width is matched and a girth is also matched.

Figure 10:
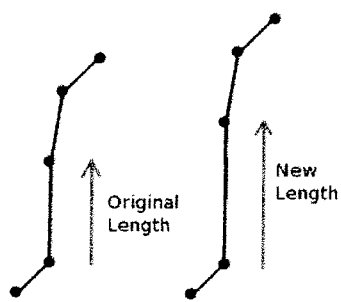
FIG. 10 shows the changing of a length on a standard 3D skeleton based on measured user data.

FIG. 10 shows an example of a length or width matching process. As shown therein, the original length of the three dimensional skeleton as formed from the standard model from the foot to the head can be changed based on the actual measurement data for the user as obtained from their images.

Figure 11:
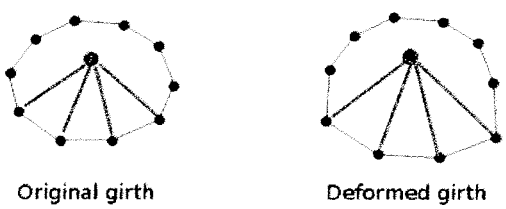
FIG. 11 shows a change in a girth on a standard three dimensional skeleton based on measured user data.

FIG. 11 shows a girth matching process. During that process the body vertices for a particular portion of the body are moved in non-linear direction. The skeleton shown in FIG. 11 does not define a girth centre but instead defines a girth "locked point" and all vertices are moved from the back to the front or vice versa, with respect to the fixed locked point. This movement of the vertices works on the assumption that muscles and fat of the body always extend mainly in one direction and not in a uniformly circular direction.

The particular example shown in FIG. 11 is a transversal cut of a body part, for example a waist or a lower leg. The system can include pre-programmed information regarding the major direction for deforming the length in a particular direction dependent on the portion of the body that is being addressed. For example, for the waist the major direction is front whereas for the lower leg it's the back. Therefore the system can make an intelligent selection for deforming the standard three dimensional skeleton to more closely resemble the actual user in question based on real body and skeleton constraints.

As can be understood from FIG. 2a, if all required measurements were obtained from the image data by the system, those measurements can be sufficient to deform the skeleton enough so that the resulting model will be an accurate model of the user and therefore the three dimensional model or "klone" can be output as shown at step 27 in FIG. 2a. As well as outputting the klone from the deformed skeleton, the exact body measurements can be extracted from the deformed skeleton for the user's body. As will be appreciated from the foregoing description, those exact measurements obtained from deformed model will be highly accurate for the user since the user's real measurement data, as obtained from their images, has been used for deformation of a standard model in order to produce the deformed model from which those measurements are extracted. Similarly, the three dimensional model output as a visual shown at step 27 of FIG. 2a will be highly accurate.
Another Method to Build a Model with Measurements In the event that all required measurements cannot be obtained from the user's images, as shown at step 23 in FIG. 2a, the system can use the external calibration information previously obtained in order to obtain any additional information required.

In order to do so, and as shown at step 28 in FIG. 2a herein, the system makes use of the external calibration information previously obtained for the user's image acquisition device in order to align the user's images with a standard 3-dimensional model. To do so the system firstly positions virtual cameras in the same positions that the user's image acquisition device was placed with respect to the floor in each of the images provided by the user. Once the virtual camera positions have been established, a standard 3D model is then placed in front of each virtual camera, at the same distance therefrom as the user was positioned from the real image acquisition device in the corresponding image and in the same user pose. Therefore the position of the standard 3D model is aligned to the user poses in each of his or her images, shown as step 29 in FIG. 2a herein.

Once the alignment 29 of the standard model and the user's images has been completed, with the virtual and real cameras aligned with one another, the standard 3-dimensional model can then be morphed 30 to the shape of the user's body.

The process of morphing the 3-dimensional model to the consumer's shape can be run using an iterative algorithm. The system can select a particular parameter or set of parameters to modify. After each parameter modification, or after a predetermined number of parameter modifications, the outline of the 3D model on each virtual camera is compared to the outline of the person in the real pictures. The parameters can be varied until the difference between the virtual outline and the real outline falls below a predetermined minimum threshold. The system can select which parameters to vary and by how much, in order to morph the standard 3-dimensional model in the manner which best represents the user.

To further improve the morphing process, the parameter variation will be applied separately to the standard 3-dimensional model in different respective poses and positions with respect to the virtual cameras, corresponding to the poses and positions in the various user images. Preferably, modifying a particular parameter for one position of the model will have the same effect for all its positions, as they are all part of the same 3D model.

Once an agreed 3-dimensional morphed model has been created, the exact measurements for the user can be obtained therefrom by locating the position of each required measurement on the morphed value and measuring its value therefrom. A visual "klone" or the 3-dimensional model of the user can also be output.

The set of measurements of the user's body extracted from the deformed standard 3-d model should substantially agree with the calculated measurements previously obtained from the user's images at step 21 of FIG. 2a. The system can check this and can reiterate any of the process steps described above in order to reach an acceptable level of agreement between the two sets of measurements.

Once the system is satisfied with the body measurements which have been extracted, the user can then begin to use their 3-dimensional model or "klone" for virtual garment try on simulation As shown at step 34 in FIG. 2, the user may in practice have to register their klone in order to begin using it for the garment fitting process. This is an administrative step and not essential to the creation of the klone as described above.
Accessorizing the User's Unique 3D Model The user may be able to add details to their klone. For example, they may be able to pick from a choice of hairstyle to try on that closely resembles their own hair or hair they would like to try like a wig. Such details can assist in outputting a 3-dimensional model which is, for example, dressed and accessorised with layered clothes and accessories. The model should be rotatable by up to 360°. The system should preferably be capable of showing the user's 3-dimensional model in animation, for example walking, and in different physical locations or scenes. The system may also be capable of enabling each user's model to be shown interacting with other animated 3D models.

The unique 3-dimensional model may be usable by the user in social networks and online communities as their profile image. The model may comprise facial animation as well as body animation. Optionally, the 3-dimensional model may be able to speak and or interact. The voice could be provided by the consumer via a microphone using voice over internet protocol (VOIP). The klone can become the consumer's representative in online worlds Optionally the system may be able to use the image of the consumer's face and map it onto the 3-dimensional model so that it looks like the consumer. Additionally or alternatively, the system may analyse facial features and proportions, hair colour, skin tone and/or hairstyle in order to further update the model and/or in order to provide garment filtration and style advice to the user.
Creating a Garment Model Conventionally in the clothing industry, designers provide enough information from which cloth can be cut and garments can be made at any factory. Usually these are produced in CAD files, of different formats, but any other file format may be used The system described herein allows the designer or another party to add additional information to the standard information provided by designers in their design file in order to automate the creation of virtual 3-dimensional garments, As well as the geometry data for a garment (the pieces), obtainable from the designer's CAD file, information on the garment's technical specification (referred to herein as meta data) is required. Meta data describes visual aspects and behavioural characteristics of the garment such as fabric material, texture, colour, pattern, elasticity, transparency and so on. A photograph of the material can also be used to create a texture map of the fabric.

Figure 2B:
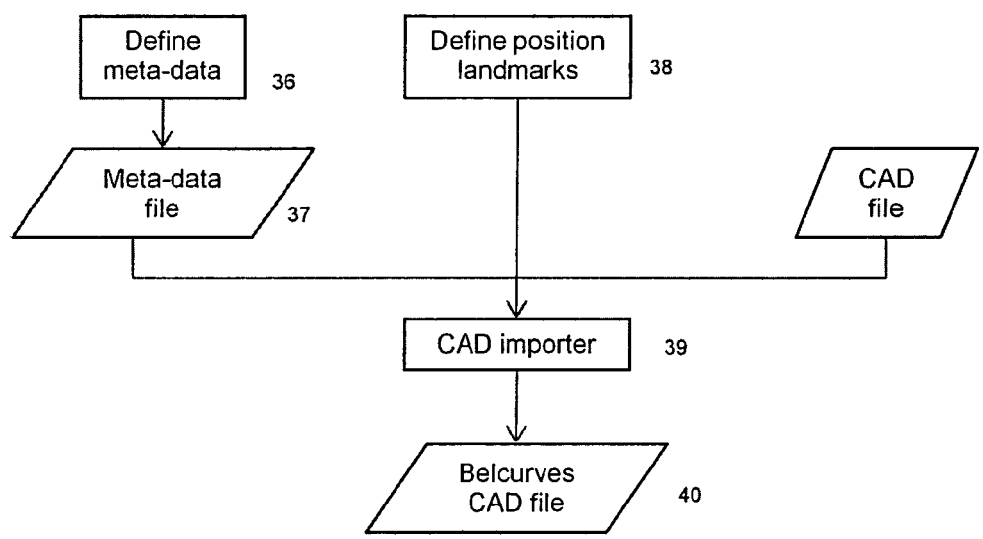
FIG. 2b shows a flow diaphragm for the garment file generation.

As shown at step 36 in FIG. 2b herein, the present system can define meta data for guiding designers to input additional data regarding their garments for the virtual 3D try on simulation service. The meta data supplied by designers can be added to the conventional CAD file for a particular garment.

Figure 12:
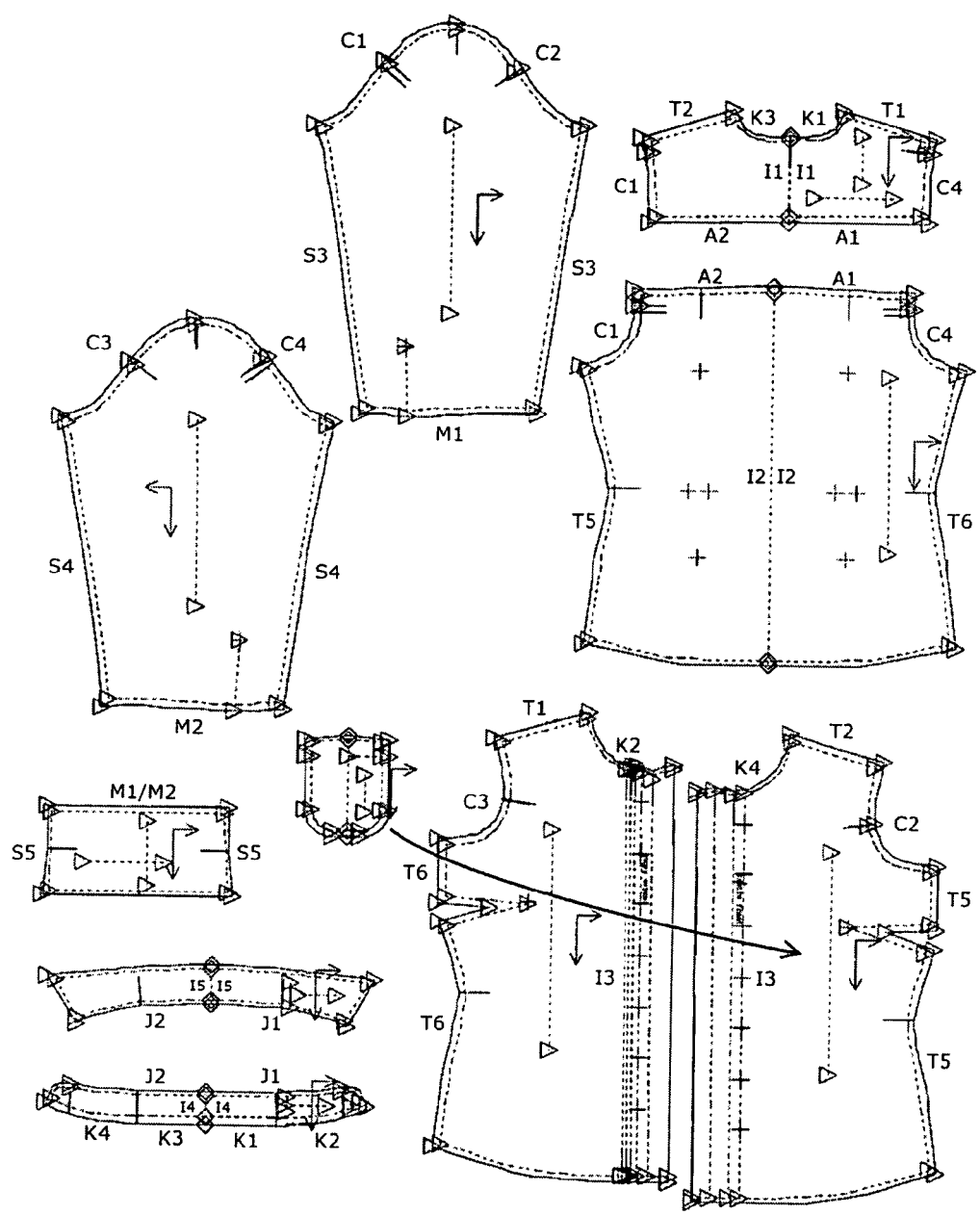
FIG. 12 shows a garment file with the garment in pieces with landmarks indicated thereon.
Figure 13:
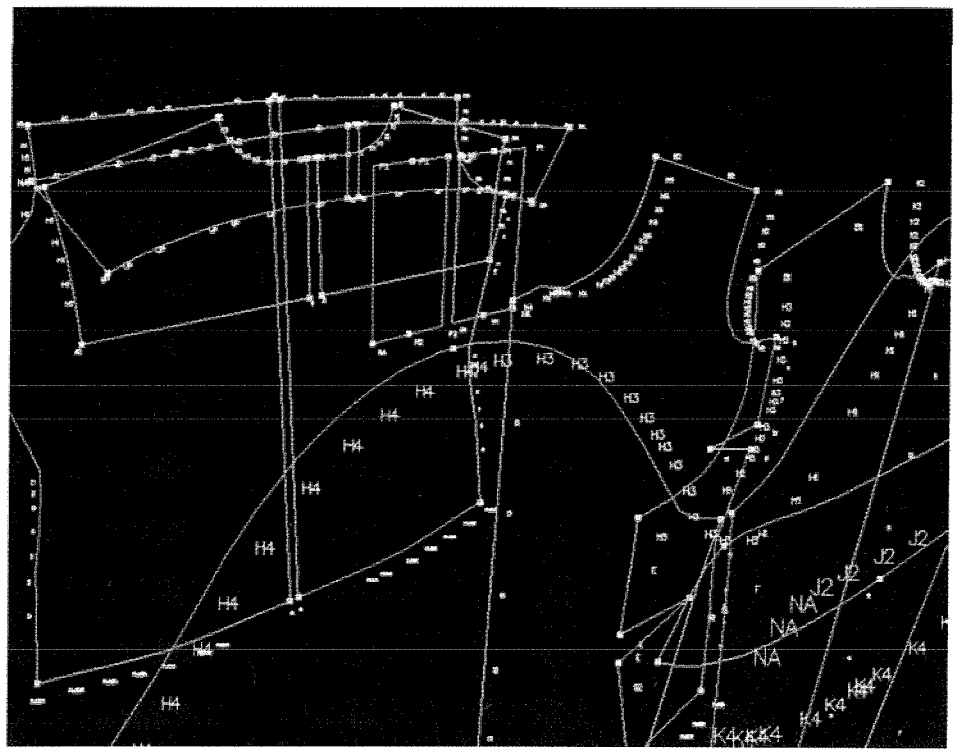
FIG. 13 shows a garment file including landmark data.

In addition to meta data, the system defines position landmarks for garments. The purpose of the landmarks is to be able to orient the garment pieces the correct way and identify which edges to stitch together to make a 3D garment—like when the real cutting of pieces and matching edges and sewing normally happens at a factory. The seams to stitch may include external borders, length between back and front sides of a garment, lengths in corners such as shoulders, internal seams or other landmarks representing direct seams on the same side of the body. FIG. 12 shows a manually created paper example of the component pieces of a garment, in this case a shirt, and the landmarks thereon labelled according to different seams to be joined. For example, the types beginning with "T" indicate a seam between the back of the shirt and the front of the shirt.

The landmark information for a garment may be created manually or semi-automatically at the design stage or afterwards, and imported into the garment file which will be used by the present system. Once the standard data, meta data and landmark information have been combined, a file suitable for the virtual try-on is ready and uploadable to the server database this is the Belcurves file mentioned above.

The standard information available from a designer in a CAD file describes the garment's geometry. Usually, the file will describe one garment but in different sizes. When a simulation is requested the system can then select a particular size e.g. 12 and select the relevant pieces of the garment that will, when stitched together, make up the whole size 12 garment from that particular CAD file. Additionally, or alternatively, if there are multiple symmetrical parts in a garment, for example, right and left sleeves, the system can store an image only of one of those parts and can duplicate it thereafter during the virtual trying-on process. The system may automatically update a stored image of a garment or garment part based on input meta data and/or landmark information. Alternatively the system may rely on manual updating of garment geometry data based on landmark and/or meta data.

The garment file (called a "Belcurves CAD file") output at step 40 shown in FIG. 2b should include a geometric representation of the garment in 3-dimensional format for each different garment size. Additional information such as where stitches, pockets, buttons, folds, cuffs or other design details are located should be also included in the same or an additional file particularly if such details are not immediately obvious from the geometry of the garment. In addition, the garment will file will include information on colour, texture and pattern, material thickness and texture, and other material properties such as stiffness and percentage split of materials used in the garment.

The file should include an image of the garment and preferably also a set of images of the cloth including any linings that may be a different colour or fabric to the main portion of the article. It should also include a lookup table showing the measurements for the designer's standard sizes (e.g. 10, 12, 14 and so on).

Virtual Try-On Simulation

Once the consumer has created a "klone", he or she can now select a garment to try on from a list or set of images of the garment, for example available from an online retail website. Before providing a visualisation of a garment fitting, the present system can assist the user by filtering out types or sizes of garment that would prima facie not be suitable. As a first check, the system can compare the body measurements extracted from the unique "klone" or 3-dimensional model for a user to predetermined information in the look-up table. The system uses the "klone" to compare the actual consumer's measurements to the manufacturer's sizing system on a per garment basis. As a result of the comparison, when the user selects a garment (e.g. black dress) the system will automatically select the first good size for a simulation.

Different suggested garment sizes may be provided dependent upon the particular type of garment that a user is searching for. For example, one size may apply to garments for the bottom half of the user's body and another size may apply for garments on the top half. Additionally, or alternatively, the suggested garment size may differ between garment style and/or between different brands of garment. The system can operate so that, if any given measurement for a garment makes it unsuitable for the user according to their 3-dimensional model's measurements and proportions, that garment will not be used in a simulation. For example, if the shoulder length of a given garment is shorter than the body shoulder measurement from the 3-dimensional model, the program will not allow this garment to be fitted to the model. This is the same as asking a shop assistant for a particular size to take into the changing room.

Figure 2C:
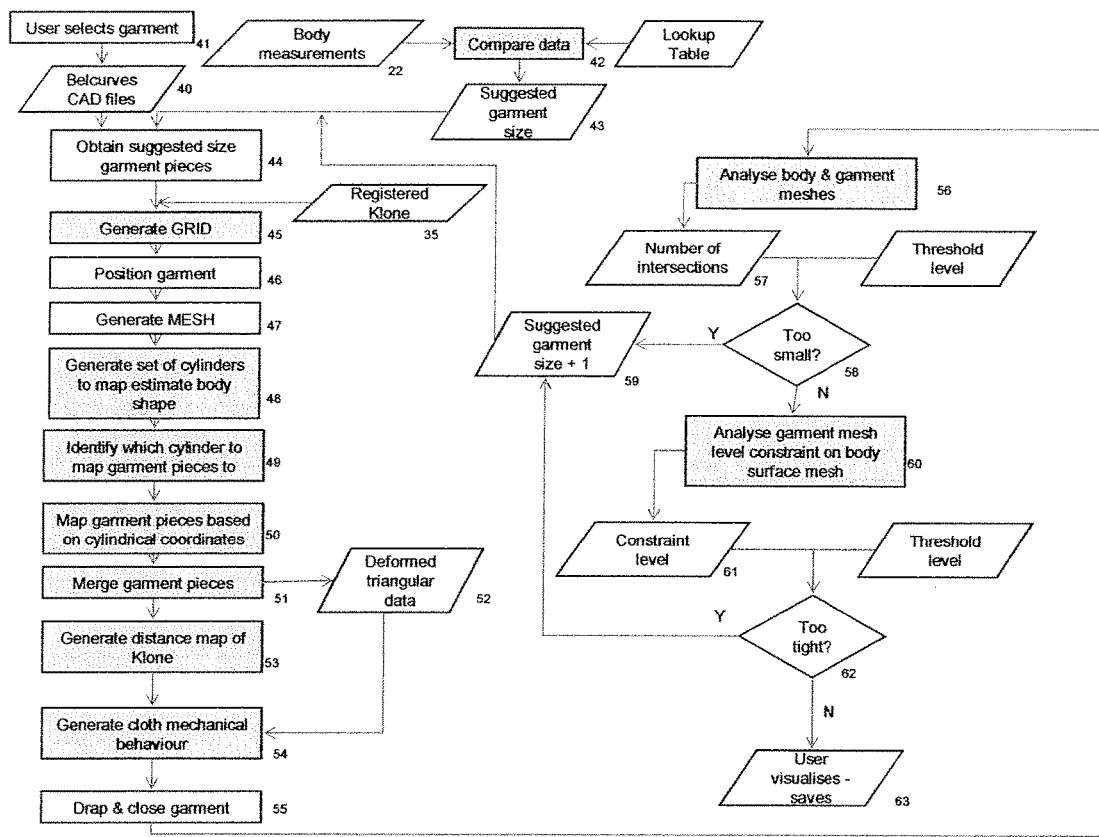

As shown in FIG. 2c, once a suggested garment size has been selected for simulation by the system it can process/search the stored garment files and obtain a subset of suggested garments from the user's initial garment selection(s).

Garment Preparation for Simulation

To begin simulating the trying a garment on the user's three-dimensional model, first a grid is generated as shown at step 45 in FIG. 2c.

The purpose of the grid generation process is to position pieces of a garment around the three dimensional model of the unique user's body. The positioning and size of the grid cells reflects the natural apportionment of body regions of the model. To be the most accurate, cells of this grid are based on the skeleton as well as body measurements acquired previous step. Thus, the size and the shape of those cells will vary according to the individual user being modelled. For example, nodes corresponding to the ankle and the knee from the skeleton are used to delimit the length of the cell which will be linked to the lower leg. Calf width and girth are used to create the sizes (width and depth) of the cell. Any suitable number of grid cells may be used as it will follow the complexity of the body skeleton.

Figure 14:
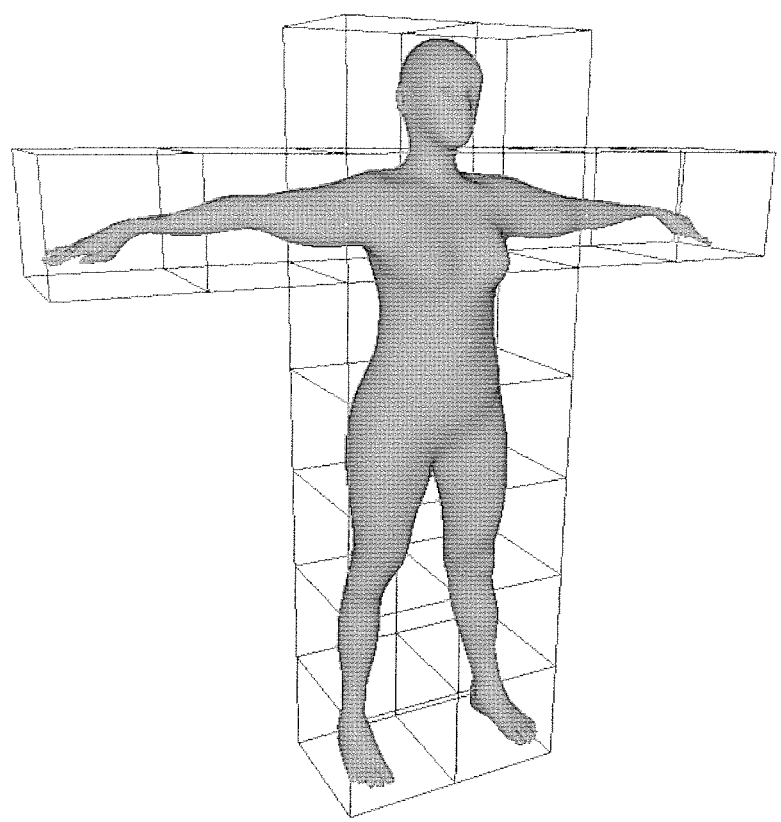
FIG. 14 shows a 3D body model clustered by a sparse grid.
Figure 15A:
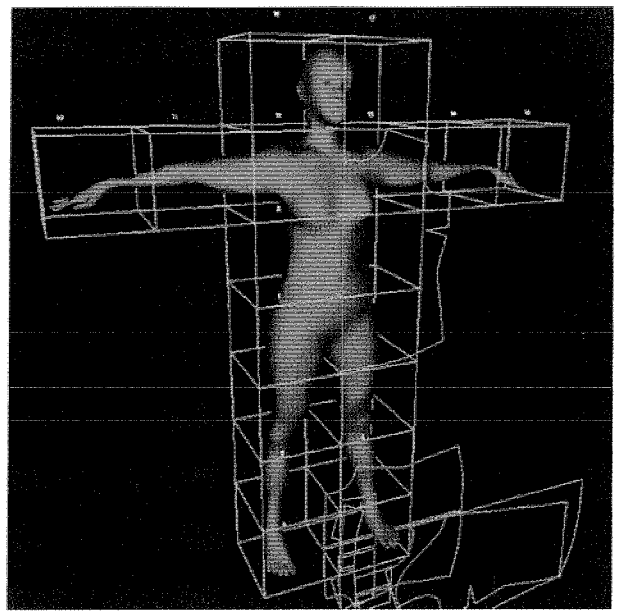
FIGS. 15a to 15c show automatic positioning of garment pieces onto the sparse grid shown in FIG. 14.
Figure 15B:
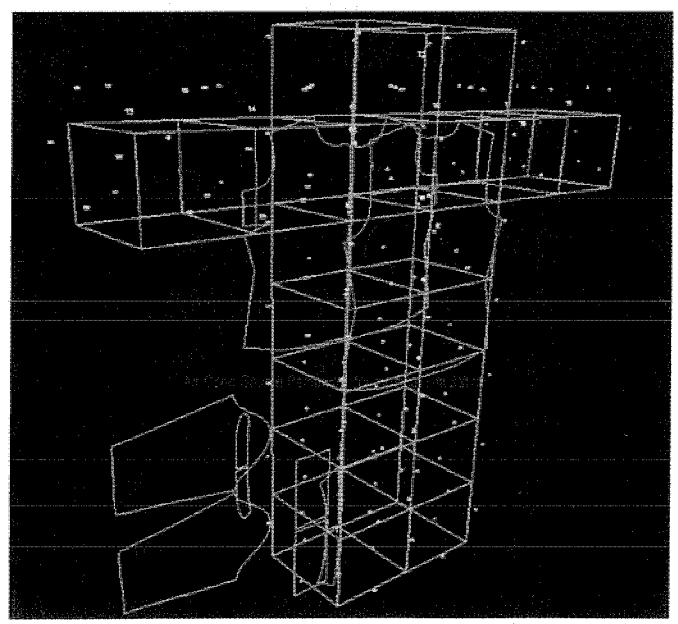
Figure 15C:
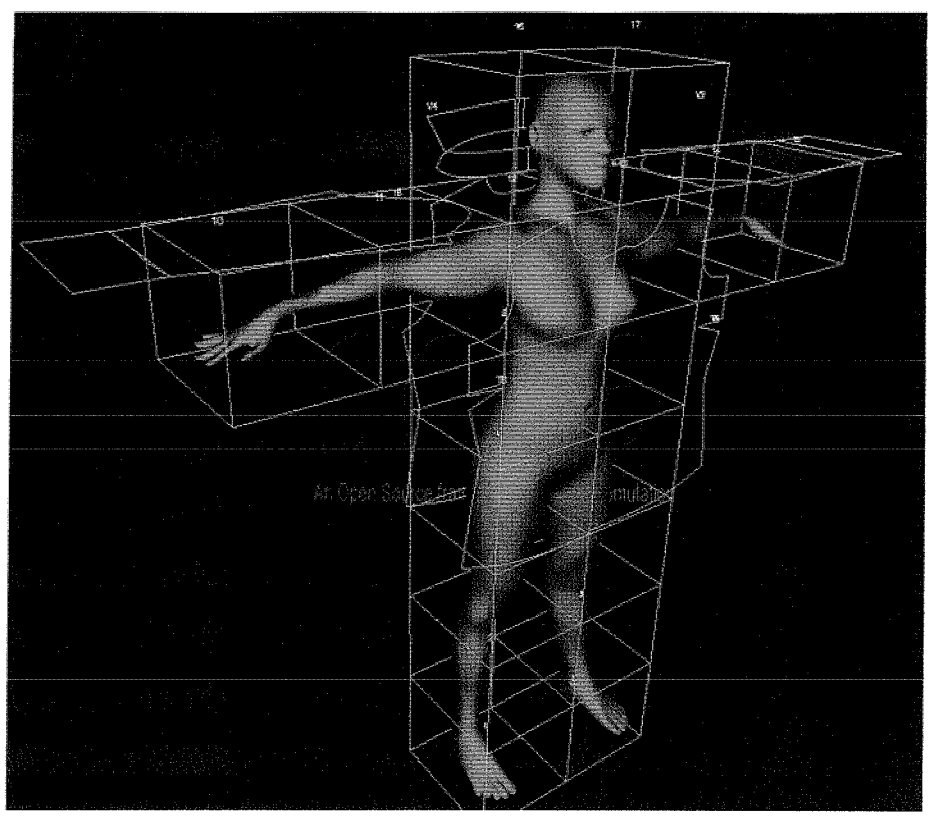

The garment can be approximately positioned around the body using the grid as shown in FIG. 14 in conjunction with the landmark information previously determined for that garment. According to an embodiment, the first step in the positioning process is to place a first piece of the garment in a corresponding cell. The cell selected for this first piece will depend on the kind of garment and on the divisioning of the grid cells in respect to the model. Once a first piece has been positioned by the system, other pieces can be added in accordance with the predefined landmarks. For example if a landmark defines a direct link between two pieces of a garment, the adjacent piece can be positioned in an adjacent cell to the first. Similarly, if a landmark defines a link on the opposite side of the body, the opposite face of the same cell is used. This process can be continued until all pieces of the garment have been assigned to a cell. This process can be understood further from FIG. 15a to FIG. 15c.

In order for the dressing process to be realistic the garment pieces must be more than just mere shape. Therefore the system recreates surface meshes which can simulate mechanically, physical draping and gathering of fabric for the garment. It can also virtually prepare edges of garment pieces to be sewn together by creating the same number of sew points on both of them. In order to do this the system defines all borders of each garment piece, which can be done using the landmarks previously defined. It can also identify borders to be sewn together and discretize them with the same number of intervals.

The clothing mesh generation process may need to combine two borders that have different respective lengths for a particular interval or portion of the garment. Any suitable sampling or interpolation process can be used to marry such different lengths to compute the border of the garment. The new points on the garment as defined by the joined borders are stored by the system and can be used for future simulation of the garment behaviour, as described further below. Indeed those borders represent the seams of the garment therefore special material specification will be applied on those points of the mesh. Finally, the process to transform garment pieces from mere shape to surface meshes will use mesh generation method known to the skilled reader and so it is not described further herein.

Figure 16:
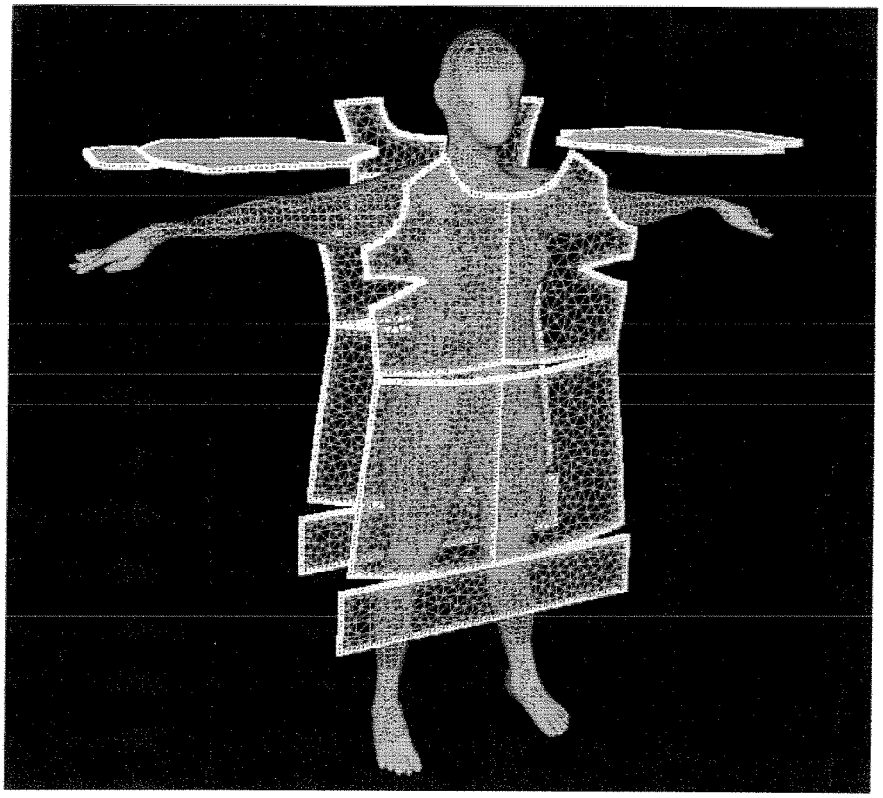
FIG. 16 shows a dress garment positioned around the body shown in FIG. 14, wherein the dress has been meshed using a Delaunay triangulation.

FIG. 16 shows an example of a meshed garment around a three-dimensional model. In this example a dress has been meshed using a Delaunay triangulation and positioned around a body.

At the end of the garment meshing stage the garment pieces should be well positioned around the three-dimensional model of the user's body but the garments will still comprise a set of plans. It has been recognised herein that, in order to begin closing the cloth for fitting the garment to the three-dimensional model, geometric pre-deformation should be performed on the garment pieces. The additional geometric pre-deformation is carried out before the automatic merging and mechanical draping of the garment on the body klone is done In order to perform this initial deformation process, the system roughly maps the three-dimensional model of the unique user as a set of cylinders. This is shown by way of example in FIG. 17. As shown therein, a separate cylinder can be defined for each of: the upper body trunk, lower body trunk, each leg, each arm and hand and the user's head. In practice any number of cylinders may be used for this mapping process.

Figure 17:
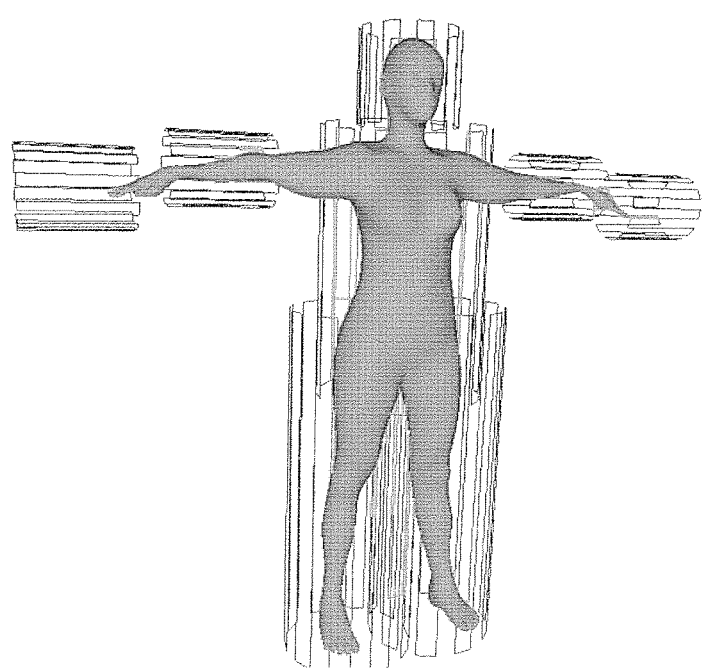
FIG. 17 shows a rough mapping of a 3D body model into cylindrical portions.

Once the three-dimensional model has been roughly mapped as shown in FIG. 17, the system then identifies which cylinder each garment piece should be matched on to. The information previously identified regarding garment positioning, shown as step 46 in FIG. 2c herein, can be used as part of this identification process. The system then maps the garment pieces based on cylinder coordinates. The body cylinder's axis and radius information can be used to transform the pieces of the garments to cylindrical coordinates and map those coordinates onto the body cylinders. Because a transformation from conventional coordinates (xyz) to cylindrical coordinates (r, theta, z) is performed, the pieces of the garment can be mapped onto the body without changing any length measurement. Hence the system maintains accuracy and can operate efficiently for the garment fitting process.

Physical Initialisation of Simulated Garment Fitting

Figure 18A:
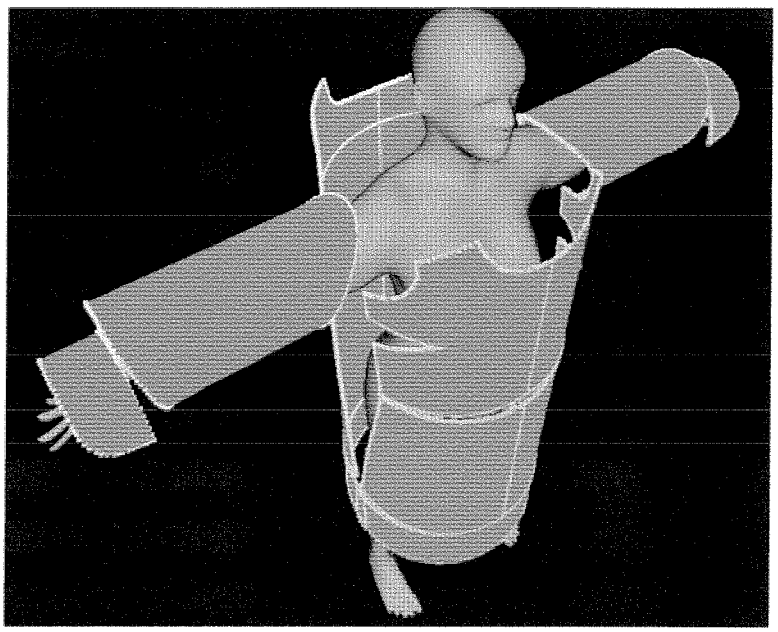
FIGS. 18a and 18b show the mapping of triangular meshes of a dress onto the body shown in FIG. 17.
Figure 18B:
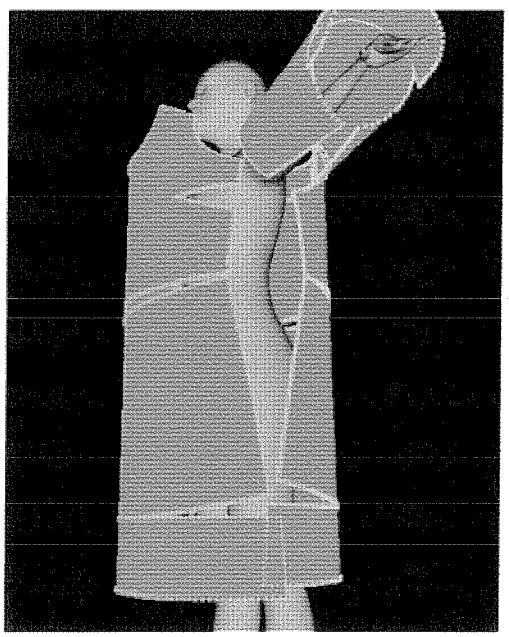

As will be appreciated from FIGS. 18a and 18b, once the garment pieces have been mapped on to the cylinders surrounding the three-dimensional body, the cloth preparation is almost complete. What remains is to merge the garment pieces together. It is important that no errors are introduced at this stage. In particular the garment must be closed without introducing error with respect to cloth length, which would be of high importance to the consumer for size accuracy. In addition the merging process should simulate the complete stitching of the finished article accurately. Preferably the system performs the garment merging by attaining a single triangulation which will be simulated mechanically with triangular finite element method. As it is known to the skilled reader, this is a common way to simulate cloth by calculating its behaviour at the level of each triangle of its mesh.

Figure 19:
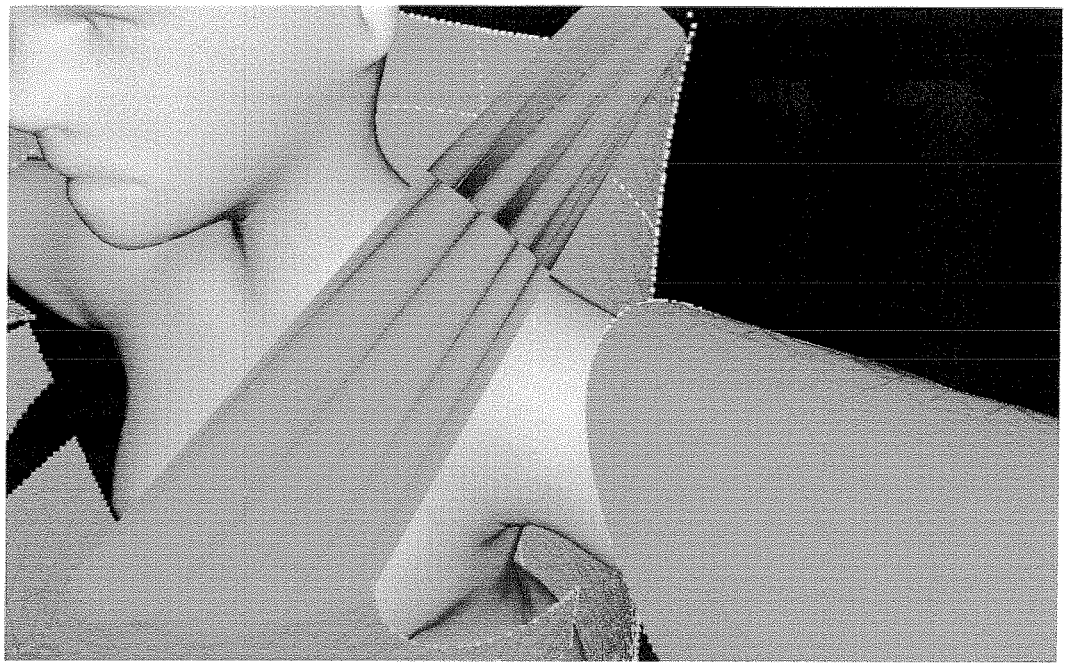
FIG. 19 shows a merging process for pieces and border pieces of the dress shown in FIGS. 18a and 18b.
Figure 20A:
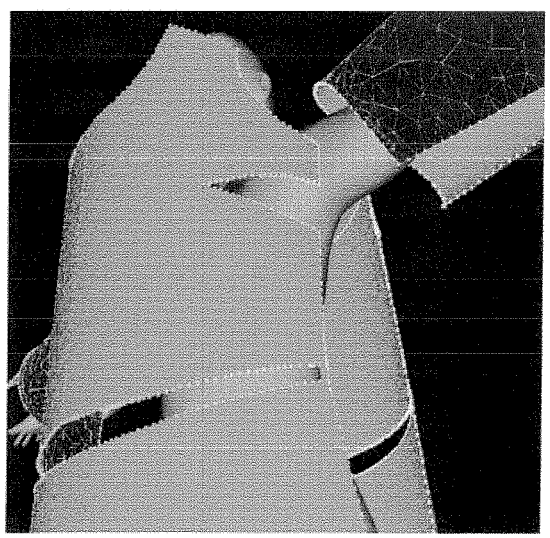
FIGS. 20a and 20b show the results of pieces merging for the dress garment shown in FIG. 19.
Figure 20B:
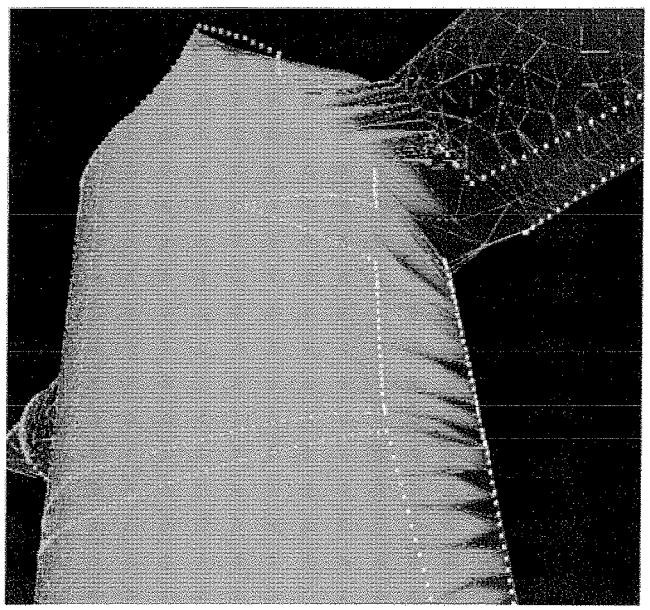

The merging process is done topologically. Where garment pieces have to be stitched, points previously defined on the garment borders are removed and the garment's structure in those areas is modified. For example if two borders labelled a and b have to be stitched, the points from border b can be moved to middle distances between borders a and b. The points from border a can then be removed and the garment's structure updated so that all triangles or other shapes defined within the garment which previously included points on borders a are using points from border b. All other borders can be similarly updated in order to allow consecutive stitches to be shown. FIG. 19 shows an example of this process for merging front and back pieces of a garment. FIGS. 20a and 20b show another example with before and after pictures of a dress being merged.

As shown at step 52 in FIG. 2c, the deformed triangular data obtained during the merging process can be saved by the system and used later in the process.

Figure 21:
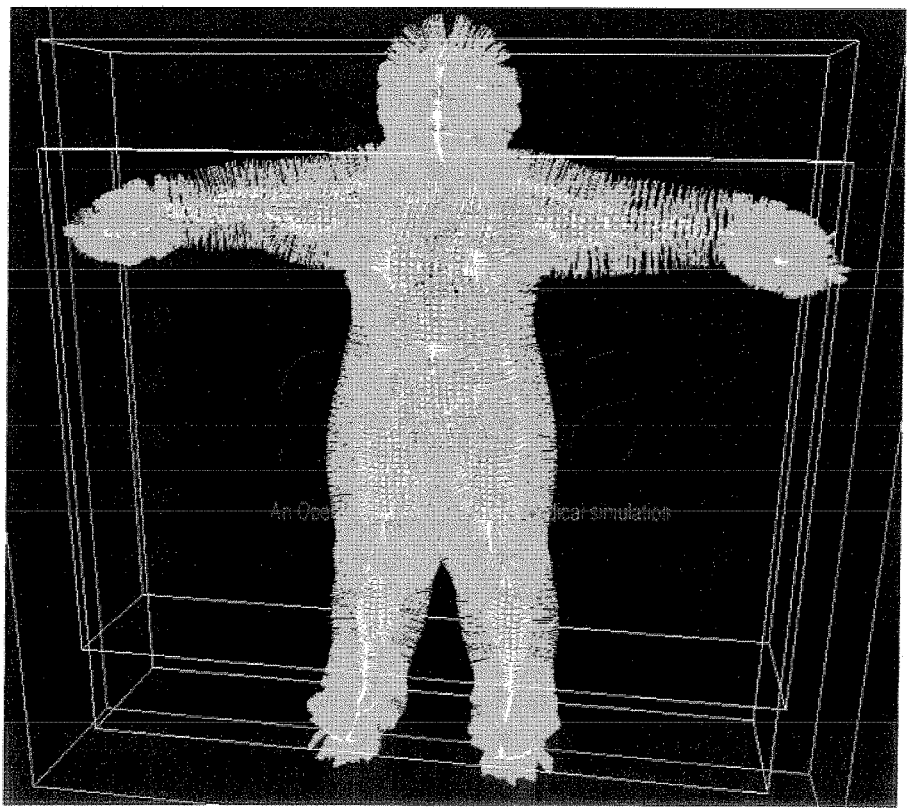
FIG. 21 shows a distance map of a body model onto which a garment has been merged as shown in FIGS. 20a and 20b.

Once the garment pieces have been merged as shown in FIGS. 19 to 20b the garment must then interact with the user's "klone" by collision in an accurate and realistic manner. To mechanically compute collision between two objects, they must be mapped on collision models. As the body is fixed, a distance map or distance transform may be used for it, wherein the distance of all points of the body from the origin of the three-dimensional scene is computed and stored in a lookup table. Often the storage may be optimised, by, for example grouping together points from the same region. This is represented in FIG. 21 herein. A distance map of the three-dimensional body is output as a result of this process. The distance map does not depend on the number of elements therein as it can be sampled and resampled as required by the system.

As the pieces of the garment will move during the draping simulation, others collision models have to be used for the garment. The garment mesh can be mapped onto triangular and/or point collision models. This means that the system will check at each iteration of the simulation if a point or a triangle of the garment mesh is intersecting other collision models from other objects in the scene. In this case, the other object is the three-dimensional model of the user's body. The system will use the distance map generated to know where the points of the body are, and thus, detect the collision with the garment.

Once a distance map for the three-dimensional model "klone" has been established and collision models have been set for the garment, the system can implement a collision simulation and then simulate real garment behaviour on a body by simulating the garment using for example triangular finite element method. In this method, computations are done on each of plurality triangles to simulate the garments material properties such as elasticity, bending, etc. Furthermore, all triangles have an initial shape and a stiffness so they can deform but they also try to converge into their initial shape.

Figure 22:
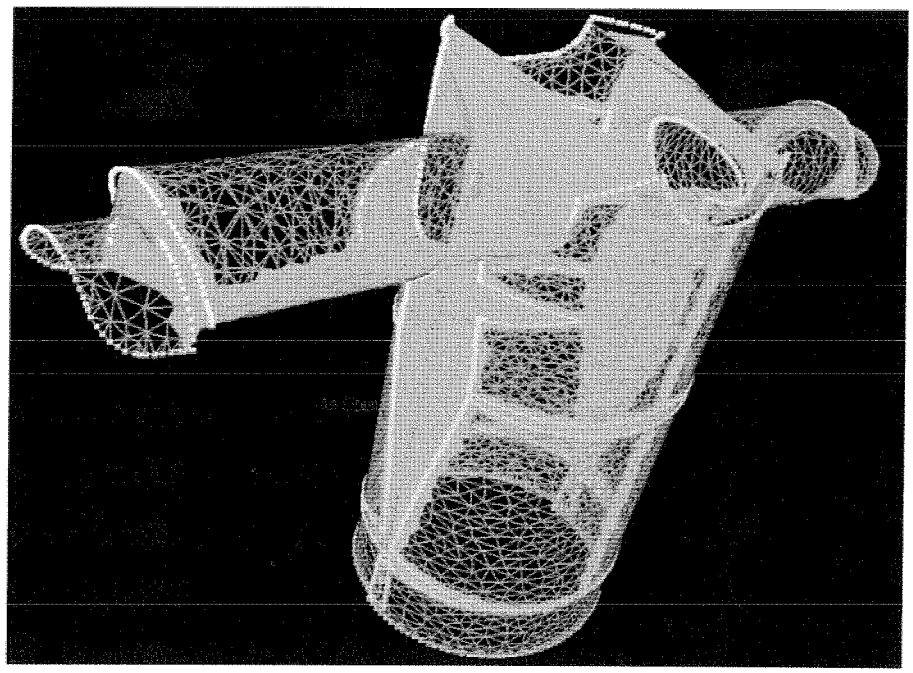
FIG. 22 shows the mesh of a dress garment after its pieces have been merged.

Because the garment has been defined as a number of component parts, and information has been provided regarding the stitching together of those parts, triangulation works well for the garment fitting simulation. Initial shapes of the deformed triangles corresponding to component garment parts which have been stored, are used in the finite element method at its initialization in order to inform the system that those triangles are already deformed. The result being that those triangles will retract themselves simulating the stitching of the garment. FIG. 22 shows an example of a dress triangle mesh after merging.

Because the garment data is processed so that the garment will attempt to regain its initial form during the merging process but at the same time will be forced to fit around the three-dimensional model of the user's body, a realistic simulation of how the garment would mechanically fit to the user is performed.

Also because the mesh of the user's body klone and the closed garment mesh are created based on real world measurements for the simulation, the mesh of the closed garment can be compared to the mesh of the three-dimensional body model. This provides a second method for gauging the right garment size for the consumer. For example if the number of intersections between the two meshes is higher than a predetermined level, this indicates that the garment is too small. If the garment is found to be too small the system can repeat the fitting process for another size.

The consumer does not do anything during the garment fitting simulation. Instead, the system can find the right garment size with its multi-level checking process. Preferably each simulation only takes seconds so the process is efficient for the consumer. For example, the consumer can be browsing clothes collections to find garments that they would like to try on next at the same time.

As a next step, the system can check to see that the garment is not too tight anywhere on the body. The check for "too tight" is different from "too small". In this case, the user might actually get the garment on but it is too tight. The garment mesh level can be analyzed to assess the extent to which it constrains the body. If the system calculates an amount of constraint above a predetermined level, it will mean that the garment is too tight for the body. Again, the system will then go get the pieces of a larger sized garment.

Once the garment and body meshes have been compared to one another and any obvious problems such as wrong size or wrong fit or wrong style have been addressed—by consideration of another size of garment, or another garment altogether and ignoring that garment for the user—the three-dimensional model of the unique user can be shown visually wearing the garment. It may be visualized in any format such as 3D for webGL or 2D. it can be displayed on any suitable interface such as a phone or computer, and to any platform or environment that can handle 3D.

After all the calculations of simulation multiple garments may be visualized worn as layers with realistic crushing and gathering. For example a shirt may be shown tucked into jeans, one with a belt and so on.

In practice, operation of the system described herein can be run and controlled using any suitable hardware or software means. Instructions for controlling the operation may be recorded in a digital or analogue record carrier or computer readable medium. The record carrier may comprise optical storage means such as a readable disc or maybe in a form of a signal such as a focussed laser beam. A magnetic record carrier such as a computer hard drive may also be used for storage of instructions for controlling the system described herein. Alternatively, solid state storage or any suitable signal recording may be employed.

A computer or other suitable processing means, for example a CPU, may be programmed to execute instructions for running the system. The processing means may also be used for recording and/or storing data relating to the system and its method of operation.

Although the above description refers to specific file formats, any suitable file format may be used. The system may be run online or offline. It may be used in conjunction with any suitable online retailing service or website.

Although the fitting of garments to a human body have been described herein, the principles described can be applied to other types of bodies including animals.

Whilst the creation of a three dimensional model of a unique body, the creation of a three dimensional model of a garment and the simulation of a garment fitting to a body have been described in combination herein, one or more of these processes may be run independently of the other(s), in combination with any other appropriate process.

The body measurements and regions to be used for the modelling and garment fitting simulation are not limited to the particular examples given herein. A three dimensional model of an individual's body may be created based on any selected measurements of that body, as obtained from two dimensional images of the body. The two dimensional images can be captured using any of a wide range of image acquisition equipment. There is no need for professional imaging or scanning equipment to be used.

Hence a user friendly model creation and virtual fitting service is provided. It enables the user to see a realistic model of themselves and to fit garments thereto in order to show what the garment would look like when worn by the user in person. The garment model used can show real physical properties such as drape, texture, tightness and movement of the garment material. Thus the user can fine tune his or her selection of garments when using an online retail service. As a result, the online retailer will be able to operate more efficiently, experiencing enhanced customer satisfaction and requiring less time and fewer resources to deal with the return of unsatisfactory goods.

What is claimed is:

1. A method of creating a three dimensional model of a unique body; said method comprising:
   obtaining a three dimensional model of a standard body;
   creating a three dimensional skeleton from the three dimensional model of the standard body;
   obtaining a two dimensional image of the unique body that is to be modelled;
   determining a location of the unique body in said image;
   determining a pose of the unique body in said image by:
   (i) performing contour detection on the unique body in the two dimensional image to determine a shape of the unique body, and
   (ii) performing shape recognition on the unique body in the two dimensional image by comparing the determined shape of the unique body to one or more predetermined body shapes;
   using the determined location and pose data to extract a two dimensional outline of the unique body from the two dimensional image;

selecting length, width, and girth measurements for which corresponding values are to be calculated for the unique body;

calculating values of said selected length, width, and girth measurements from the extracted two dimensional outline;

matching corresponding length, width, and girth measurements of the three dimensional skeleton with said calculated values of the selected length, width, and girth measurements to update the three dimensional skeleton; and outputting the updated three dimensional skeleton as a three dimensional model of the unique body, the three dimensional model of the unique body being deformed compared to the three dimensional model of the standard body, wherein the deformation reflects the length, width, and girth measurements calculated from the two dimensional image of the unique body.

2. A method as claimed in claim 1 wherein the step of extracting a two dimensional outline of the unique body from the two dimensional image includes detecting a contour of the unique body in the two dimensional image, calculating at least one contour derivative and refining the detected contour using said contour derivative.

3. A method as claimed in claim 1 wherein the step of extracting a two dimensional outline of the unique body from the two dimensional image includes identifying an anomaly in the extracted outline and deleting said anomaly and further comprising replacing the deleted anomaly with a replacement outline portion, a curvature of said replacement outline portion being calculated using a curvature of at least one adjacent portion on the outline.

4. A method as claimed in claim 3 further comprising replacing the deleted anomaly with a replacement outline portion, a curvature of said replacement outline portion being calculated using predetermined information regarding body shapes.

5. A method as claimed in claim 1 further comprising obtaining a two dimensional image of a calibration object and wherein the step of calculating a value of said predetermined measurement from the extracted two dimensional outline comprises projecting a portion of said two dimensional outline and a portion of said calibration object onto a common plane and using a known measurement value for the calibration object to obtain a value of said predetermined measurement for the unique body.

6. A method as claimed in claim 1 further comprising obtaining at least one measurement value for the unique body from the output three dimensional model of the unique body and further comprising comparing said at least one measurement value obtained from the three dimensional model of the unique body to the value of said predetermined measurement obtained from the extracted two dimensional outline.

7. A method as claimed in claim 6 further comprising updating the three dimensional model of the unique body as a result of said comparison.

8. A method of simulating trying on a garment comprising creating a three dimensional model of a unique body according to the method of claim 1 and fitting a three dimensional model of the garment to said body model.

9. A method as claimed in claim 1 wherein the measurement for which a value is to be calculated comprises any of: a heel to toe measurement, an ankle to knee measurement, a knee to thigh measurement, a thigh to hip measurement, a hip to waist measurement, a length of a portion of the unique body, a width of a portion of the unique body, and a girth of a portion of the unique body.

10. A method as claimed in claim 1 further comprising defining a region within the two dimensional outline of the unique body in which the selected measurement is likely to be located, identifying a maximum and/or a minimum width within said region and calculating the value of the selected measurement from said maximum and/or minimum width.

11. A method as claimed in claim 1, further comprising:
defining a plurality of component parts of the garment;
obtaining geometric data for the garment, said geometric data being sufficient for the garment to be manufactured from its component parts;
obtaining landmark data for the garment, said landmark data comprising at least one indicator to determine the position of a connection to be made between first and second parts of the garment;
using said geometric data and landmark data to generate a model of component parts of the garment.

12. A method as claimed in claim 11 further comprising obtaining specification data for the garment, said specification data including data on at least one of: the visual appearance of the garment and the mechanical behaviour of the garment and using said specification data to update the model of component parts of the garment.

13. A method as claimed in claim 11 wherein said geometric data includes a look-up table defining measurements for one or more pre-determined garment sizes.

14. A method of modelling a garment for simulating fitting of that garment to a unique body, said method comprising;
obtaining a three dimensional model of the unique body according to the method of claim 1;
defining a grid surrounding said three dimensional body, wherein individual cells of the grid encompass different respective portions of the modelled body;
obtaining a model of the garment to be fitted, said model including first and second parts of the garment separate from one another;
positioning said first and second parts of the garment in selected cells of the grid, wherein said cells are selected according to a relationship between the encompassed portions of the modelled body and the first and second parts of garment; and
aligning said first and second parts of the garment in preparation for bringing them together.

15. A method as claimed in claim 14 further comprising bringing the first and second parts of the garment together and wherein the step of bringing said first and second parts of the garment together includes merging a border on said first garment part with a border on said second garment part.

16. A method as claimed in claim 14 further comprising obtaining a cylindrical map of the body, wherein said cylindrical map comprises a plurality of cylinders approximating a corresponding plurality of regions of the three dimensional model of the body, and applying a cylindrical coordinate body.

17. A method of simulating the fitting of a garment to a body, comprising:
modelling the garment as claimed in claim 14;
bringing said first and second parts of the garment together;
outputting a three dimensional model of the complete garment after said first and second parts have been brought together; and comparing said three dimensional model of the garment to the three dimensional model of the body.

18. A method of simulating the fitting of a garment to a unique body, comprising:
    obtaining a three dimensional model of the unique body according to claim 1;
    obtaining a three dimensional model of the garment to be fitted;
    simulating a collision between said three dimensional model of the unique body and said three dimensional model of the garment; and
    outputting a visualisation of the fitting as a result of said collision.

19. A method as claimed in claim 18 further comprising the step of, before a visualisation of the fitting is output, analysing one or more collision points between the two models to determine whether the garment is too small for the body.

20. The method of claim 1, wherein the step of extracting a two dimensional outline of the unique body comprises comparing a shape of the unique body in the two dimensional image to a plurality of predetermined body poses that are stored in a database.

\* \* \* \* \*